United States Patent [19]
Sakai et al.

[11] Patent Number: 6,153,013
[45] Date of Patent: Nov. 28, 2000

[54] DEPOSITED-FILM-FORMING APPARATUS

[75] Inventors: Akira Sakai, Kyoto; Shotaro Okabe, Nara; Masahiro Kanai; Yuzo Kohda, both of Kyoto; Tadashi Hori, Nara; Tomonori Nishimoto; Takahiro Yajima, both of Kyoto, all of Japan

[73] Assignee: Canon Kabushiki Kaisha, Tokyo, Japan

[21] Appl. No.: 08/800,512

[22] Filed: Feb. 14, 1997

[30] Foreign Application Priority Data

Feb. 16, 1996 [JP] Japan .................................... 8-054170
Feb. 16, 1996 [JP] Japan .................................... 8-054175

[51] Int. Cl.$^7$ .................................................... C23C 16/06
[52] U.S. Cl. ..................... 118/719; 118/729; 118/730; 118/723
[58] Field of Search .................... 118/719, 729, 118/730, 723; 156/345 PC, 345 MC; 204/298.25, 298.35

[56] References Cited

U.S. PATENT DOCUMENTS

| | | | |
|---|---|---|---|
| 4,400,409 | 8/1983 | Izu et al. | 427/39 |
| 4,438,723 | 3/1984 | Cannella et al. | 118/718 |
| 4,951,602 | 8/1990 | Kanai | 118/719 |
| 5,102,279 | 4/1992 | Ezaki et al. | 414/217 |

FOREIGN PATENT DOCUMENTS 6-1288074 12/1986 Japan .
61-288074 12/1986 Japan .

OTHER PUBLICATIONS

Henkel, D.P.; Doolittle, L.R.; J. Vac. Sci. Technol. A 12(5), Sep./Oct. 1994.
Henkel, et al, J. Vac. Sci. Technol. A 12(5), Sep. 1/Oct. 1994.
Ishimaru, H., J. Vac. Sci. Technol. A 2 (2), Apr. 1–Jun. 1984.
Momose, T., J. Vac. Sci. Technol. A 9 (4), Jul. 1/Aug. 1991.
Ishimaru, et al, J. Vac. Sci. Technol. A 6 (3), May 1/Jun. 1988.
Gutleben, H., et al J. Vac. Sci. Technol. A 9 (1), Jan. 1/Feb. 1991.
Fitch, J.T., et al, J. Vac. Sci. Technol. A 11 (15), Sep. 1/Oct. 1993.

*Primary Examiner*—Gregory Mills
*Assistant Examiner*—Rudy Zervigon
*Attorney, Agent, or Firm*—Fitzpatrick, Cella, Harper & Scinto

[57] ABSTRACT

The deposited-film-forming apparatus of the present invention is an apparatus for forming deposited films while continuously passing a belt-like member through the insides of a plurality of vacuum chambers connected via connecting members and superposingly forming a plurality of different thin films on the surface of the belt-like member by plasma-assisted CVD, wherein the vacuum chambers are fixed to a stand for supporting the vacuum chambers, and a mechanism for relaxing stress acting in the transport direction of the belt-like member, generated in the vacuum chambers by the action of expansion and contraction due to thermal expansion of the vacuum chambers, is provided between each vacuum chamber and each connecting member.

10 Claims, 7 Drawing Sheets

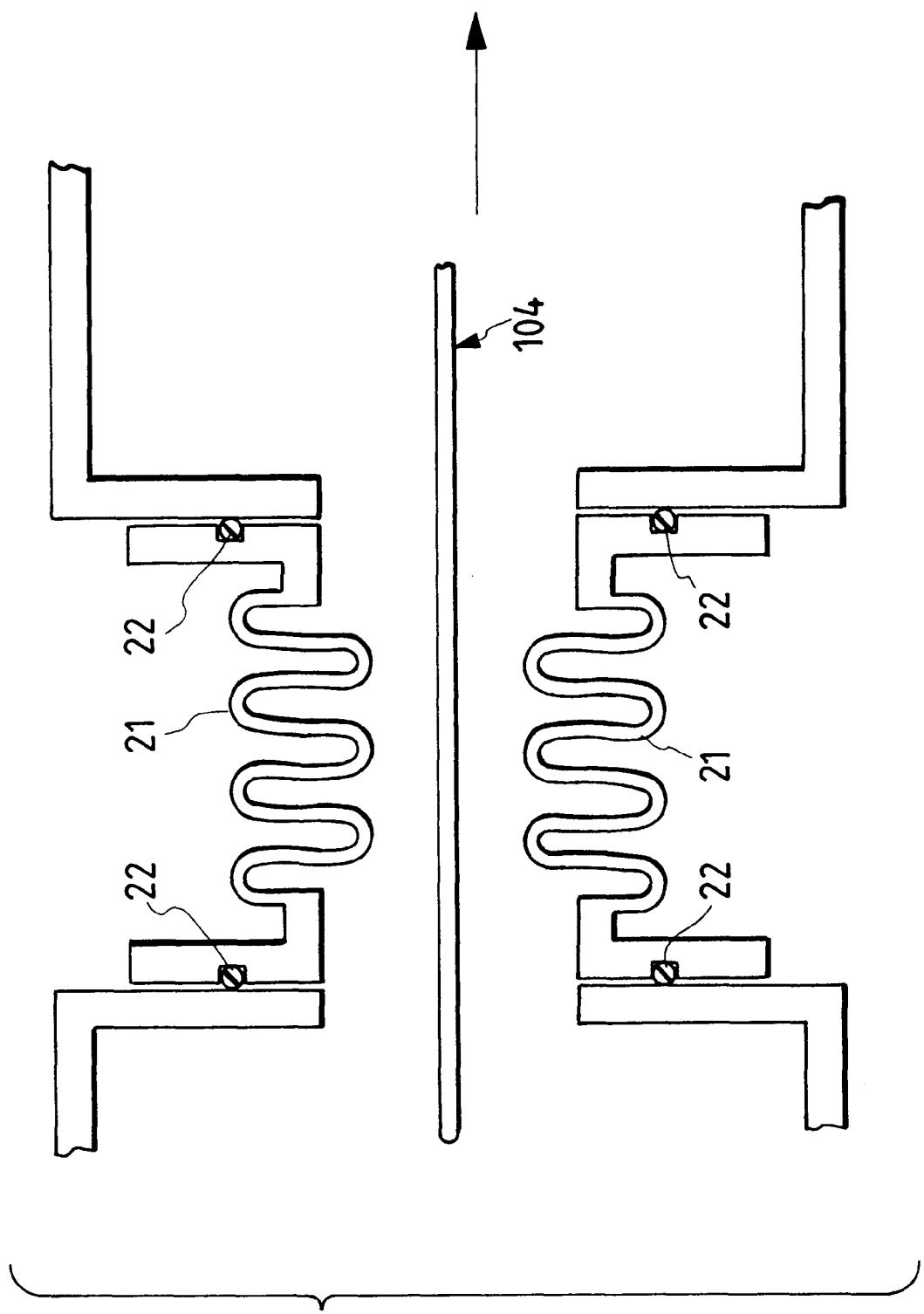

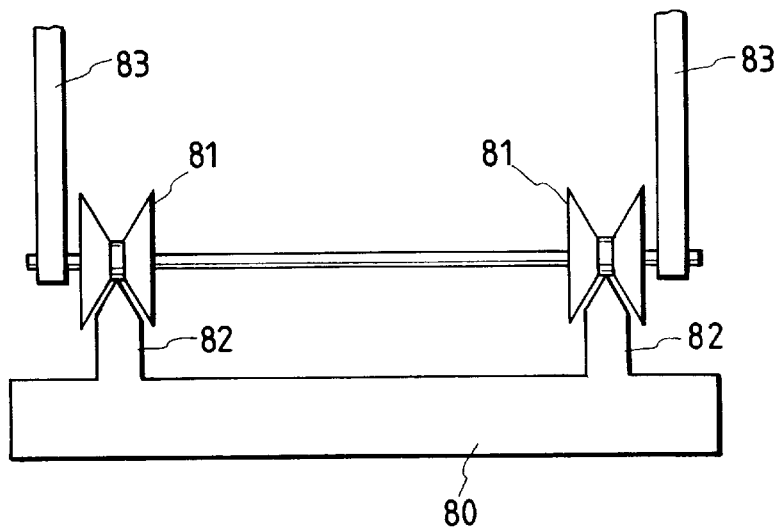
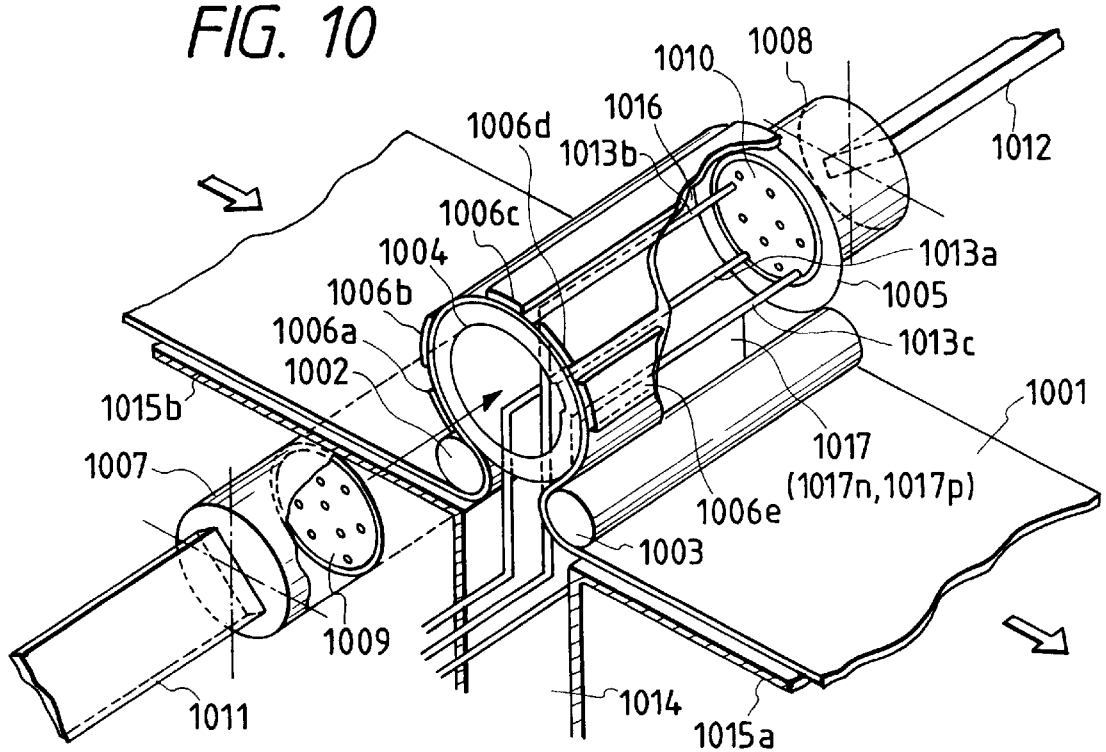

DEPOSITED-FILM-FORMING APPARATUS

BACKGROUND OF THE INVENTION

1. Field of the Invention

This invention relates to a deposited-film-forming apparatus for superposingly forming a plurality of different thin films on the surface of a belt-like member by plasma-assisted chemical vapor deposition (CVD). More specifically, it relates to an apparatus for continuously mass-producing photovoltaic devices such as solar cells by using a roll-to-roll system.

2. Related Background Art

With regard to photovoltaic devices, semiconductor layers which are important constituents thereof have semiconductor junctions such as pn junctions or pin junctions.

When thin-film semiconductors such as amorphous silicon (hereinafter, often a-Si) are used, material gases containing elements such as phosphine ($PH_3$) and diborane ($B_2H_6$) acting as dupants are mixed with a main material gas such as silane, and glow-discharge decomposition is effected to obtain semiconductor layers having desired conductivity types. It is known that these semiconductor layers are successively superposingly formed on a desired substrate, thus the above semiconductor junctions can be achieved with ease. Accordingly, to produce photovoltaic devices of an a-Si type, methods are proposed in which independent film-forming chambers for forming the respective semiconductor layers are successively provided and each semiconductor layer is formed in each film-forming chamber. In this connection, U.S. Pat. No. 4,400,409 discloses a continuous plasma-assisted CVD apparatus employing a roll-to-roll system.

As reported therein, according to this apparatus, a plurality of glow-discharge regions are provided and a sufficiently long, flexible substrate having a desired width is provided along the course where the substrate passes successively through the glow discharge regions. The substrate is continuously transported in its longitudinal direction while semiconductor layers with required conductivity types are deposited in the respective glow-discharge regions, whereby devices having semiconductor junctions can be continuously produced.

The above apparatus also utilizes gas gates which are used so that dopant gases used when the semiconductor layers are formed can be prevented from diffusing and mixing into other glow-discharge regions.

Stated specifically, the respective glow-discharge regions are separated from each other by slit-shaped separation paths, and means for flowing scavenging gas such as Ar or $H_2$ through the separation paths are employed.

However, in such a conventional vacuum apparatus, a plurality of vacuum chambers are provided in a connected form when it is set up as a mass-production apparatus. Hence, the apparatus tends to have a large size and, in particular, to be very long in the transport direction of a belt-like member (substrate).

Thus, the apparatus for producing photovoltaic devices by the conventional roll-to-roll system type plasma-assisted CVD tends to be very long in the transport direction of the belt-like member. In addition, when attempting to obtain photovoltaic performance with desired characteristics, processes have been taken to raise the temperature of the belt-like member and to change the temperature for the baking of the vacuum chambers in order to remove impurities. However, the heat history due to the repetition of thermal expansion caused by such processes and contraction caused by cooling acts as stress in the vacuum chambers to bring about strain, in particular, to cause cracks at portions having a low strength, and has a possibility of causing a problem of leaking.

SUMMARY OF THE INVENTION

Accordingly, an object of the present invention is to solve the above problems involved in conventional apparatus and to provide a deposited-film-forming apparatus that makes stabler transport of a heated belt-like member stabler and can mass-produce a thin film, in particular, for photovoltaic devices, as a thin film having good uniformity in characteristics and having fewer defects.

To achieve the above object, in the present invention, the deposited-film-forming apparatus for producing a thin film, particularly for photovoltaic devices, is constituted as described below.

The deposited-film-forming apparatus of the present invention is an apparatus for forming deposited films while continuously passing a belt-like member through the insides of a plurality of vacuum chambers connected via connecting members and superposingly forming a plurality of different thin films on the surface of the belt-like member by plasma-assisted CVD, wherein the vacuum chambers are fixed to a stand for supporting the vacuum chambers, and a mechanism for relaxing stress acting in the transport direction of the belt-like member, generated in the vacuum chambers by the action of expansion and contraction due to thermal expansion of the vacuum chambers, is provided between each vacuum chamber and each connecting member.

In the present invention, the mechanism for relaxing stress may be constituted of an expansion-contraction absorbing mechanism that absorbs the shift of the vacuum chamber. In such an instance, in the present invention, the expansion-contraction absorbing mechanism may have a bellows structure or a structure in which a plurality of O-rings made of rubber are superposed.

In the present invention, the above connecting members may each be constituted of a gas gate, thus a deposited-film-forming apparatus especially suited for photovoltaic devices can be made.

In the present invention, as another mechanism for relaxing stress generated in the apparatus, a sliding mechanism may be provided by which the vacuum chamber itself can be readily moved. In such an instance, the sliding mechanism may be formed of a warped member attached to a leg of the vacuum chamber, or formed of a spherical member attached to a leg of the vacuum chamber, or still formed of a wheel-like member attached to a leg of the vacuum chamber.

In the present invention, the sliding mechanism may be constituted in such a way that the shift of the vacuum chamber in a direction right-angled to the transport direction of the belt-like member is limited by means of a slide-limiting mechanism, and a lubricant may be provided at a part where the sliding mechanism comes into contact with the stand.

In the present invention, among the vacuum chambers connected in plurality, a vacuum chamber provided at the middle of the course in which the vacuum chambers are connected and arranged in the transport direction may be fixed to the stand.

BRIEF DESCRIPTION OF THE DRAWINGS

FIG. 2 is a cross-sectional view showing an example of the expansion-contraction absorbing mechanism.

FIG. 8 is a diagrammatic view showing a still further example of the sliding mechanism.

FIG. 10 is a perspective view showing an example in which the belt-like member is bent to form a cylindrical space forming a film.

Figure 1:
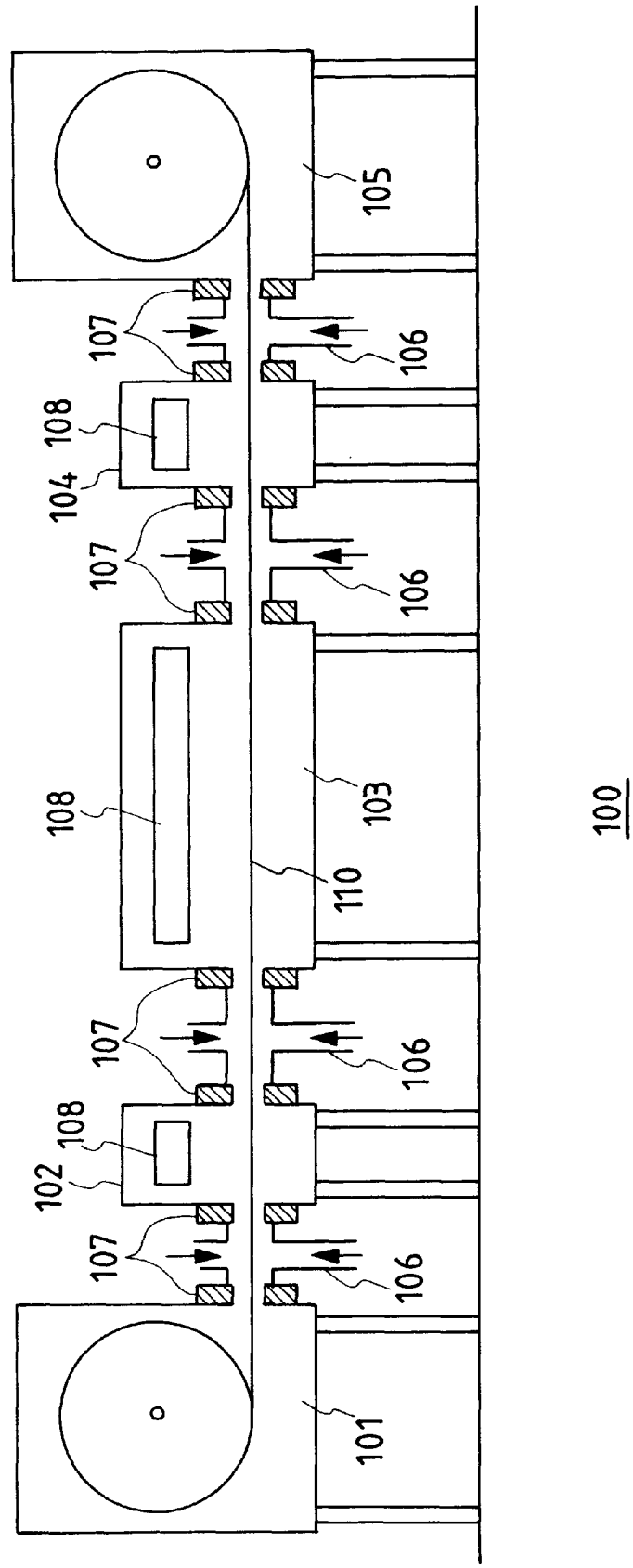
FIG. 1 is a cross-sectional view showing the deposited-film-forming apparatus of the present invention.

DESCRIPTION OF THE PREFERRED EMBODIMENTS (1) Expansion-contraction absorbing mechanism:

FIG. 1 diagrammatically illustrates a roll-to-roll type film-forming apparatus.

A roll-to-roll type film-forming apparatus 100 comprises as vacuum chambers an unloading chamber 101, an n-type semiconductor layer deposition chamber 102, an i-type semiconductor layer deposition chamber 103, a p-type semiconductor layer deposition chamber 104 and a winding chamber 105, which are connected with each other through gas gates 106 as connecting members. Each deposition chamber is provided with a heating infrared lamp 108. In the course where a belt-like member (hereinafter, often substrate) 110 is passed through the deposition chambers 102, 103 and 104, the n-type, i-type and p-type semiconductor layers are successively formed. A transparent conductive layer may be formed using an apparatus similarly made up.

In each gas gate 106, scavenging gas is flowed from the upper part and lower part (as shown by the arrows in FIG. 1) so that material gases in the deposition chambers connected adjacently to each other are prevented from being intermingled.

At a connecting zone for each chamber, an expansion-contraction absorbing mechanism 107 is provided.

To deposit semiconductor layers in the respective deposition chambers, microwave CVD, high-frequency wave CVD, thermal CVD, photo CVD or the like is appropriately used. To deposit a metal oxide as a transparent conductive layer, sputtering, resistance heat vacuum deposition, electron-beam vacuum deposition or the like is used.

The expansion-contraction absorbing mechanism may be provided at every position between the vacuum chambers fixed to a stand. With regard to a vacuum chamber that requires no heating steps such as the heating of the belt-like member and the baking of the vacuum chamber, the chamber may either be provided or not be provided with the expansion-contraction absorbing mechanism.

In the present invention, the vacuum chambers may be fixed to the stand by a means such as bolt-fastening or welding. In view of the management of maintenance made by disassembling and adjusting the vacuum chambers and connecting members, the vacuum chambers may preferably be fixed in such a manner that they can be relatively easily dismounted from and fixed to the stand.

In the present invention, the expansion-contraction absorbing mechanism may preferably be expandable and contractable by 30 mm and 60 mm, respectively, at maximum in the transport direction of the belt-like member, regarding as the starting point the position where the vacuum chamber is stable at room temperature, and more preferably by 15 mm and 30 mm, respectively, as expansion-contraction distance.

In the present invention, the expansion-contraction absorbing mechanism provided at the connecting zone may have a bellows structure capable of expanding and contracting in the transport direction of the belt-like member. This makes it possible to achieve the expansion-contraction distance within the above ranges.

The bellows structure may be formed of a material appropriately selected from metals such as Al, Ni, Ti, Mo, W, Fe, V, Cr and stainless steel, taking account of its mechanical strength and easy processing.

The expansion-contraction absorbing mechanism may have a cross-sectional shape which depends on the width of the belt-like member and the cross-sectional shape of the connecting member. In view of easy processing, it may have a rectangular, square, circular or oval cross section.

The expansion-contraction absorbing mechanism can be made up utilizing expansion-contraction properties of an O-ring.

In the present invention, the O-ring may be made of an elastic material such as nitrile rubber, silicone rubber or fluorine rubber, any of which may preferably be used.

The expansion-contraction distance can be determined by appropriately selecting the rubber diameter of the O-ring. In usual instances, when the O-ring has a diameter of 10 mm, the tolerance of expansion and contraction of rubber while maintaining the function of vacuum sealing at the vacuum chambers and connecting members is about 2 mm, and hence it is necessary to use several O-rings superposed in order to achieve the above expansion-contraction distance.

In this instance, as flanges used for superposing the O-rings, it is possible to use a plurality of flanges of a "plane sheet form" and those of a "groove form" having grooves to which O-rings are fitted.

Photovoltaic devices may be produced using the above apparatus of the present invention for continuously producing photovoltaic devices. Thus, the problems stated previously can be solved and also the belt-like member continuously moved can be more stably transported.

In addition, this consequently makes it possible to produce photovoltaic devices having a high quality and a good uniformity.

The expansion-contraction absorbing mechanism used in the present invention will be described below in a specific manner.

FIG. 2 is a partially enlarged cross-sectional view of the apparatus according to the present invention, and illustrates bellows members 21 serving as the expansion-contraction absorbing mechanism, attached to every position between the respective vacuum chambers 101 to 105 and connecting members.

In FIG. 2, the bellows member 21 functions as a cushioning mechanism that relaxes the stress applied in the transport direction (as shown by an arrow in FIG. 2) of a belt-like member 104 that is generated when each vacuum chamber shifts from its original position upon thermal expansion and contraction repeated in the transport direction. In FIG. 2, reference numeral 22 denotes an O-ring for vacuum sealing.

Figure 3A:
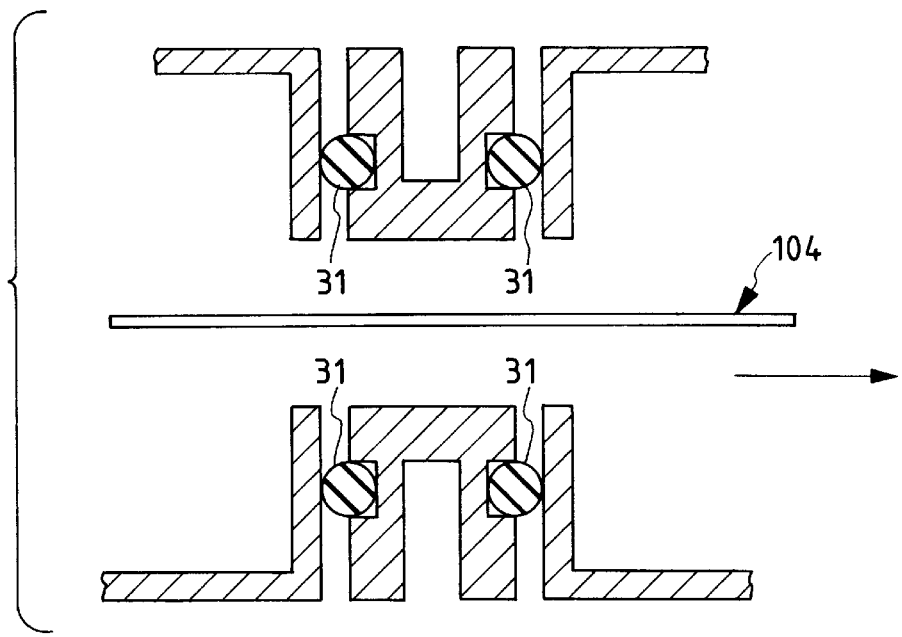
FIGS. 3A and 3B are cross-sectional views showing examples of the expansion-contraction absorbing mechanism.

FIG. 3A is a cross-sectional view of another the expansion-contraction absorbing mechanism employing O-rings. In FIG. 3A, each O-ring is provided between the vacuum chamber and the connecting member, and can relax the stress generated when each vacuum chamber shifts in the transport direction (as shown by an arrow in FIG. 3A) upon its expansion and contraction.

As to the expansion-contraction distance of the O-ring, it is necessary to ensure an expansion-contraction distance long enough to maintain the vacuum of the vacuum chamber within the range of the expansion and contraction of the vacuum chamber. Stated specifically, when the O-ring has a diameter of 10 mm, the tolerance of expansion and contraction that is necessary for maintaining the vacuum is 1 mm on the expansion side and 1 mm on the contraction side.

Figure 3B:
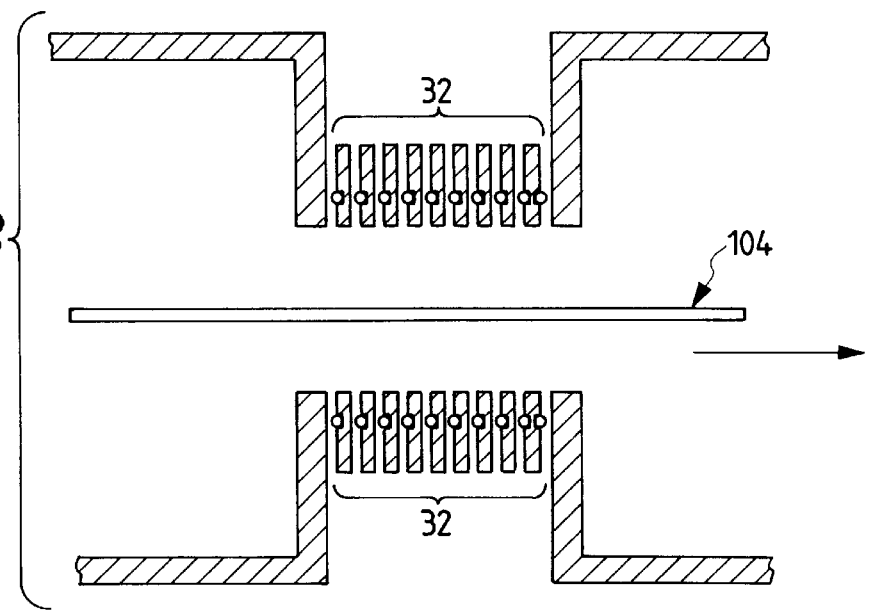

In order to ensure more expansion and contraction, as flanges for superposing a plurality of O-rings as shown in FIG. 3B, a plurality of flanges of a "plane sheet form" and those of a "groove form" having grooves to which O-rings are fitted may be used. As the result, it is possible to ensure expansion and contraction of, e.g., 10 mm on the expansion side and 10 mm on the contraction side. The transport direction of the belt-like member is shown by an arrow in FIG. 3A.

(2) Sliding mechanism:

Another method for relaxing the stress generated in the apparatus is to provide a sliding mechanism that can shift the vacuum chamber itself with ease. In the present invention, the mechanism of sliding the vacuum chamber in the transport direction of the belt-like member may be provided at all the vacuum chambers provided in a line in the transport direction. Also, the middle-positioned vacuum chamber to which substantially no stress is applied may be fixed to the stand.

According to the sliding mechanism of the present invention, the vacuum chamber is brought into contact with the stand by point contact, line contact or face contact without any fixing means such as bolt fastening or welding. Further, a lubricant may be optionally used at the contact portion so that the sliding mechanism can make the vacuum chamber more readily shiftable.

In the present invention, a wheel-like rotary motion may be utilized so that the sliding mechanism can make the vacuum chamber readily shiftable.

In this way, the vacuum chambers can freely shift in the transport direction of the belt-like member.

Meanwhile, the vacuum chambers can be made slidable also in the direction right-angled to the transport direction. In such an instance, it is preferable to provide a mechanism for appropriately limiting over-sliding also in order to make the arrangement of the vacuum chambers stable.

In the present invention, the mechanism for appropriately limiting over-sliding comprises guides provided in parallel to the transport direction of the belt-like member so as to serve as a barrier for limiting any excessive shift of the vacuum chamber when it shifts to the direction right-angled to the transport direction.

The sliding mechanism of the present invention will be described below in a specific manner.

Figure 4:
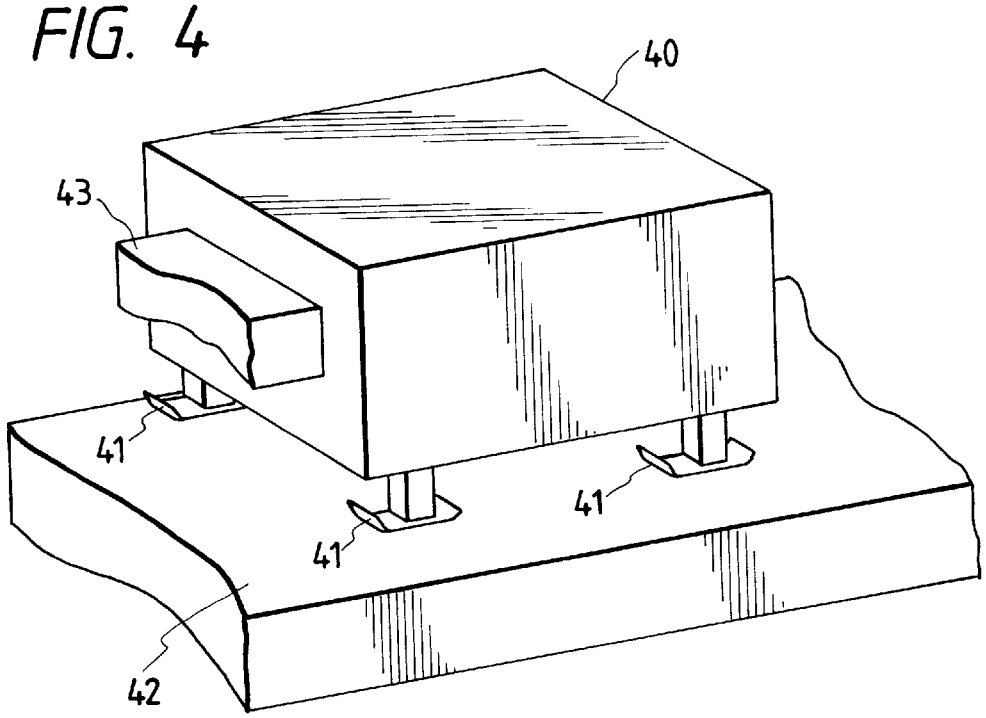
FIG. 4 is a diagrammatic view showing an example of the sliding mechanism.

FIG. 4 is a partial diagrammatic view of the apparatus of the present invention, provided with a sliding mechanism comprising a warped member 41 fixed to each of legs at the bottom four corners of the vacuum chamber.

As shown in FIG. 4, the warped member is upward warped at its edges in the direction vertical to the transport direction of the belt-like member 43 so that it can decrease the friction with a stand 42 when the vacuum chamber shifts while repeating thermal expansion and contraction.

Among the vacuum chambers 40 arranged in a line in the transport direction of the belt-like member 43, the vacuum chamber disposed at the middle may be fixed to the stand 42.

The warped member 41 and the stand 42 may be formed mainly of a material appropriately selected from metals such as Al, Ni, Ti, Mo, W, Fe, V, Cr and stainless steel, taking account of their mechanical strength and easy processing.

With regard to the surface properties of the warped member and stand, they may preferably have mirror surfaces finished by buffing. A lubricant may also be applied to the contact surfaces in order to more decrease the friction with the stand 42.

Figure 5:
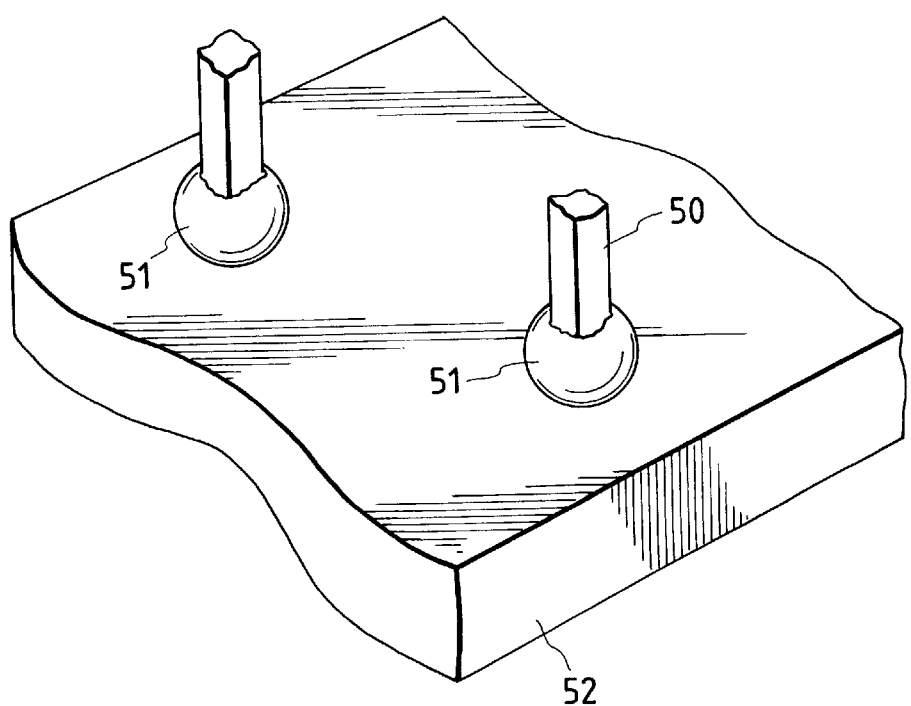
FIG. 5 is a diagrammatic view showing another example of the sliding mechanism.

FIG. 5 diagrammatically illustrates another example of the sliding mechanism. In FIG. 5, as the sliding mechanism, spherical sliding members 51 are attached to legs 50 of the vacuum chamber (not shown), and come into point contact with a stand 52 to make the vacuum chamber smoothly shiftable.

Figure 6:
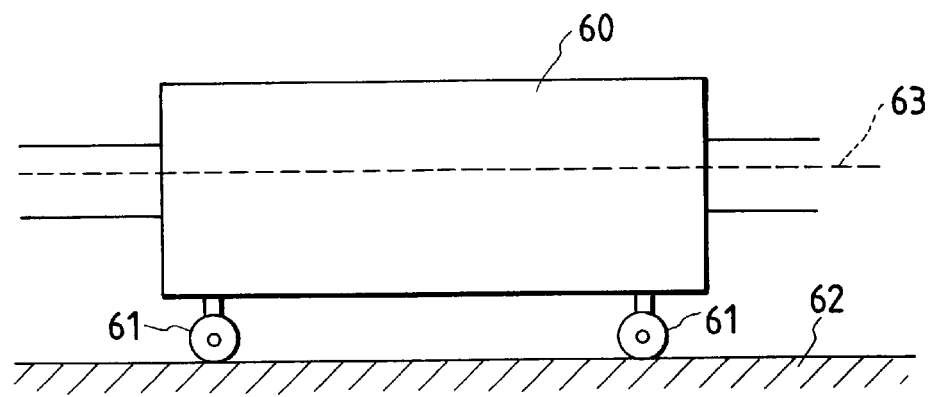
FIG. 6 is a diagrammatic view showing still another example of the sliding mechanism.

FIG. 6 shows still another example of the sliding mechanism according to the present invention. As shown in FIG. 6, the sliding mechanism is constituted of wheels 61 and makes a vacuum chamber 60 smoothly shiftable on a stand 62 in the transport direction of the belt-like member 63.

Figure 7:
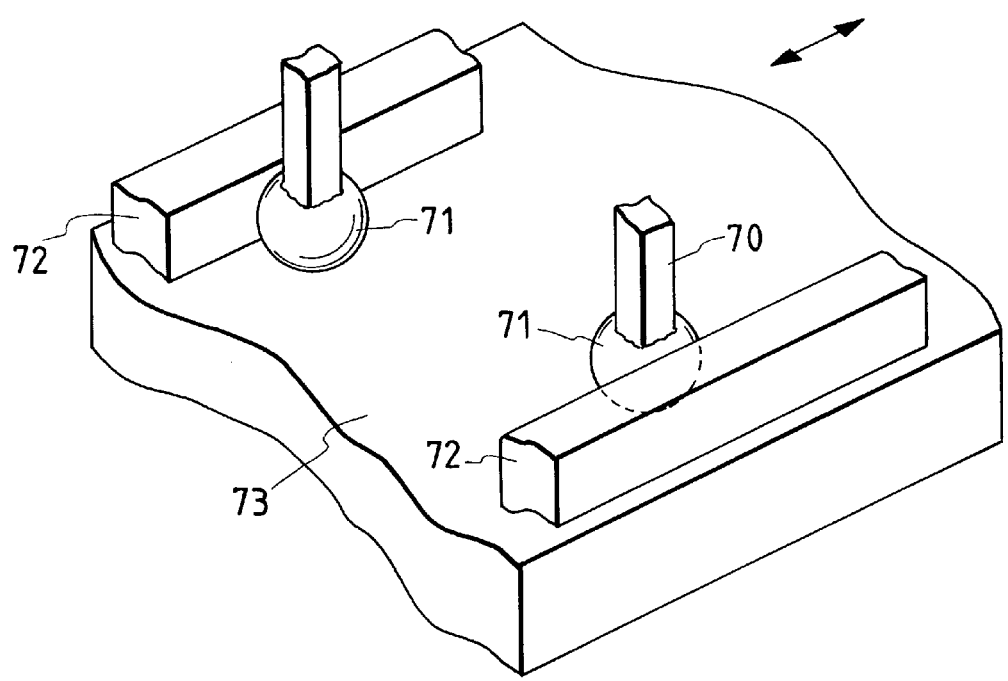
FIG. 7 is a diagrammatic view showing a further example of the sliding mechanism.

FIG. 7 is a diagrammatic view showing a slide-limiting mechanism 72. As shown in FIG. 7, it limits the sliding direction of sliding members 71 which correspond to the spherical sliding members 51 described above. Members constituting the slide limiting mechanism 72 are provided in parallel to the belt-like member transport direction (as shown by an arrow in FIG. 7), and the mechanism is so constructed that each vacuum chamber (not shown) does not drop off a stand 73 and also the vacuum chambers connected and arranged in the belt-like member transport direction are limited on their shift in the direction right-angled to the transport direction. The sliding mechanism 71 is attached to each of legs 70 of the vacuum chamber (not shown).

FIG. 8 diagrammatically illustrates still another example of the sliding mechanism according to the present invention. As shown in FIG. 8, rails 82 are provided on a stand 80 in parallel to the belt-like member transport direction. Also, wheels 81 attached to legs 83 of the vacuum chamber (not shown) are made smoothly movable on the track of the rails 82.

Belt-like Member

The belt-like member preferably used in the present invention may preferably be made of a material that may cause less deformation and strain at the temperature required at the time of the formation of semiconductor layers, has a desired strength and has a conductivity. Stated specifically, it may be formed of a thin sheet of a metal such as stainless steel, aluminum and alloys thereof, iron and alloys thereof and copper and alloys thereof, and a composite material of such sheets, and any of these materials having thin metallic films of different materials and/or insulating thin films of $SiO_2$, $Si_3N_4$, $Al_2O_3$, AlN or the like formed on the surface by surface coating treatment such as sputtering, vacuum deposition or plating.

The belt-like member may also be formed of a sheet made of a heat-resistant resin such as polyimide, polyamide, polyethylene terephthalate or epoxy resin, or a composite of any of these with glass fiber, carbon fiber, boron fiber, metallic fiber or the like, whose surface has been subjected to conductive treatment by plating, vacuum deposition, sputtering or coating of a single metal or an alloy thereof or a transparent conductive oxide (TCO).

The belt-like member may have a thickness as small as possible taking account of cost and stock space and so long as it exhibits a strength enough to maintain a curved shape when it is transported by the transport means. Stated specifically, it may preferably have a thickness of from 0.01 mm to 5 mm, more preferably from 0.02 mm to 2 mm, and most preferably from 0.05 mm to 1 mm. Use of the thin sheet of a metal or the like makes it easy to obtain the desired strength even if its thickness is made smaller.

The belt-like member may have any width without any particular limitations, depending on the means for forming semiconductor layers and the size of chambers therefor.

The belt-like member may have any length without any particular limitations, and may have such a length that it can be wound up into a roll. Sheets with a continuous length may be connected by welding or the like so as to be made more continuous.

In the case when the belt-like member is made of an electrically conductive material such as a metal, it may be made to serve as an electrode for directly taking out electric currents. In the case when it is made of an electrically insulating material such as a synthetic resin, it may preferably be beforehand subjected to surface treatment on the side where the semiconductor layers are formed, by a process such as plating, vacuum deposition or sputtering of a single metal or an alloy thereof or a transparent conductive oxide (TCO), such as Al, Ag, Pt, Au, Ni, Ti, Mo, W, Fe, V, Cr, Cu, stainless steel, brass, Nichrome, $SnO_2$, $In_2O_3$, ZnO, $SnO_2$–$In_2O_3$ (ITO) to prepare an electrode for taking out electric currents.

In the case when the belt-like member is made of a non-light-transmitting material such as a metal, a reflective conductive film for improving reflectance of long-wavelength light on the substrate surface may preferably be formed on the belt-like member. The reflective conductive film may be formed of a material including Ag, Al and Cr as materials preferably used.

For the purposes of, e.g., preventing constituent elements from mutually diffusing between the substrate material and the semiconductor layers and providing a buffer layer for preventing short circuit, a metal layer or the like may preferably be provided as the reflective conductive film on the substrate at its side where the semiconductor layers are formed.

The buffer layer may be formed of a material including ZnO as a material preferably used.

When the belt-like member is relatively transparent and a solar cell has such a layer configuration that the light is made incident on the belt-like member side, a conductive thin film such as the above transparent conductive oxide or metal thin film may preferably be beforehand formed by deposition.

As surface properties of the belt-like member, it may have a smooth surface or may have a surface with fine irregularities. In the case when it has a surface with fine irregularities, the irregularities may be spherical, conical or pyramidal, and may preferably have a maximum height (Rmax) of from 500 Å to 5,000 Å, whereby the reflection of light on the surface can be made irregular to bring about an increase in light-path length of the light reflected on the surface.

Gas Gate

The gas gate of the deposited film-forming apparatus of the present invention will be described below.

In the present invention, a gas gate means is preferably used to separate and isolate the vacuum chambers for feeding and winding up the belt-like member from the vacuum chambers for forming semiconductor layers and to allow the belt-like member to pass through these chambers so as to be continuously transported.

The gas gate means is required to have the ability not to mutually diffuse atmospheres formed by semiconductor layer material gases used, due to a pressure difference generated between the respective chambers.

As its basic concept, the gas gate means disclosed in U.S. Pat. No. 4,438,723 may be employed. Its ability, however, must be improved.

Stated specifically, the gas gate means is required to withstand a pressure difference of about $10^6$ times at maximum, and an oil diffusion pump, a turbo molecular pump, a mechanical booster pump or the like, having a large exhaust capacity, may preferably be used as an exhaust pump.

The gas gate may have a cross-sectional shape of a slit, or a shape similar thereto, and its size may be calculated and designed using a usual expression of conductance calculation, in conformity with its whole length and the discharge capacity of the discharge pump. In order to more improve the ability of separation, a gate gas may preferably be used in combination, which may include, e.g., rare gases such as Ar, He, Ne, Kr, Xe and Rn or dilute gases for forming semiconductor layers, such as $H_2$.

The flow rate of the gate gas may be appropriately determined according to the conductance of the whole gas gate and the capacity of the exhaust pump used. For example, when a point at which the pressure becomes maximum is set at substantially the middle of a gas gate, the gate gas flows from the middle of the gas gate to both vacuum chamber sides, so that the mutual gas diffusion between the both-side chambers can be made a minimum.

In practice, the amount of the diffused gases may be measured using a mass analyzer or the semiconductor layer formed may be compositionally analyzed, to thereby determine optimum conditions.

Photovoltaic Device

Figure 9A:
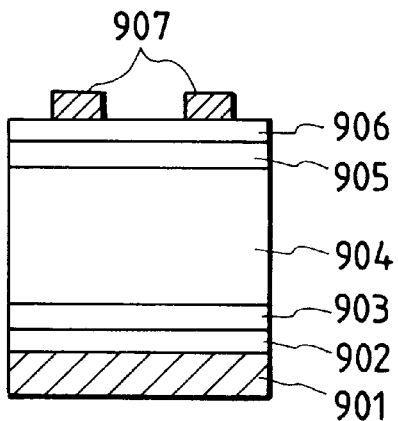
FIGS. 9A, 9B and 9C are cross-sectional views showing examples of the photovoltaic device that can be produced by the deposited-film-forming apparatus of the present invention.
Figure 9B:
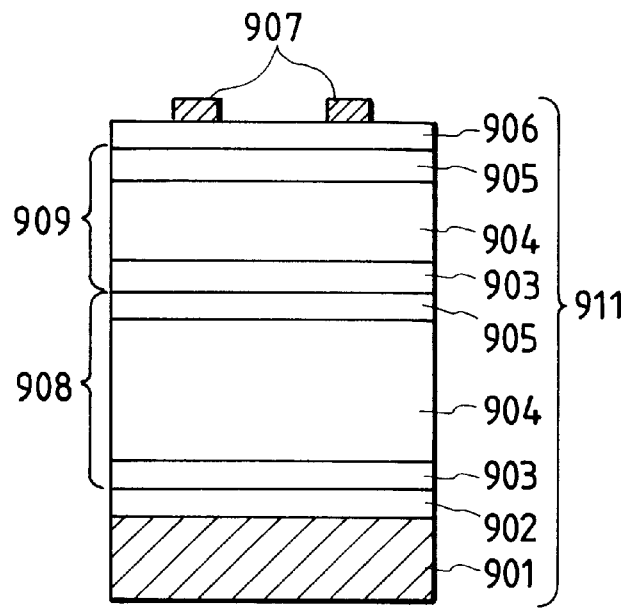
Figure 9C:
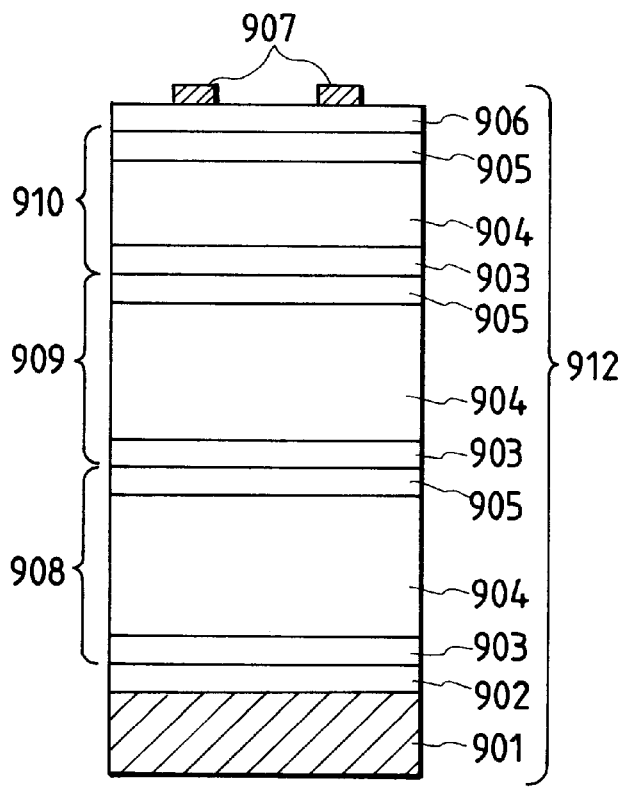

FIGS. 9A to 9C are diagrammatic views showing examples of the constitution of the photovoltaic device that can be produced by the apparatus of the present invention.

The example shown in FIG. 9A is constituted of a belt-like member 901, a lower electrode 902, a semiconductor layer 903 having a first conductivity type (hereinafter "first-conductivity type layer"), an i-type semiconductor layer (hereinafter "i-type layer") 904, a semiconductor layer 905 having a second conductivity type (hereinafter "second-conductivity type layer"), an upper electrode 906, and a collector electrode 907.

The example shown in FIG. 9B is what is called a tandem type (or double type) photovoltaic device made up by superposing two Sets of photovoltaic devices employing as i-type layers two semiconductor layers having different bandgap and/or layer thickness, and is constituted of a belt-like member 901, a lower electrode 902, a first-conductivity type layer 903, an i-type layer 904, a second-conductivity type layer 905, a first-conductivity type layer 903, an i-type layer 904, a second-conductivity type layer 905, an upper electrode 906, and a collector electrode 907.

The example shown in FIG. 9C is what is called a triple type photovoltaic device made up by superposing three sets of photovoltaic devices employing as i-type layers three semiconductor layers having different bandgap and/or layer thickness, and is constituted of a belt-like member 901, a lower electrode 902, a first-conductivity type layer 903, an i-type layer 904, a second-conductivity type layer 905, a first-conductivity type layer 903, an i-type layer 904, a second-conductivity type layer 905, a first-conductivity type layer 903, an i-type layer 904, a second-conductivity type layer 905, an upper electrode 906, and a collector electrode 907.

The constitution of the photovoltaic devices will be described below.

As the belt-like member 901 used in the present invention, a member made of a flexible material may preferably be used, which may be either electrically conductive or electrically insulating. Such materials may also be either light-transmittive or non-light-transmittive. In the case when light is made incident on the side of the belt-like member 901, the material must of course be light-transmittive.

Stated specifically, the belt-like member may include the belt-like member previously described as used in the present invention. Use of such a belt-like member can make the photovoltaic devices produced light-weight, make their strength higher and make their transport space smaller.

As the electrode of the photovoltaic device, the belt-like member can serve also as the lower electrode in the case when the belt-like member 901 is electrically conductive. However, when belt-like member 901 is electrically conductive but has a high sheet resistivity, the lower electrode 902 may be provided as a low-resistance electrode for taking out electric currents or for the purposes of enhancing reflectance and effectively utilizing incident light.

Materials for the electrode may include metals such as Ag, Au, Pt, Ni, Cr, Cu, Al, Ti, Zn, Mo and W or alloys of these. Thin films of any of these metals may be formed by vacuum deposition, electron beam deposition, sputtering or the like.

Care must also be taken so that the metal thin films formed do not serve as resistance components against the output of the photovoltaic device, and may preferably have a sheet resistivity of 50 Ω or less, and more preferably 10 Ω or less.

Not shown in FIGS. 9A to 9C, a buffer layer for preventing short circuits and preventing diffusion, formed of, e.g., ZnO, may be provided between the lower electrode 902 and the first-conductivity type layer 903. The buffer layer can be effective for, e.g., not only preventing metal elements constituting the lower electrode 902, from diffusing into the first-conductivity type layer 903, but also, when a slight resistivity is imparted thereto, preventing short circuits from being caused by defects such as pinholes between the lower electrode 902 and the upper electrode transparent electrode 906 which are provided interposing the semiconductor layers, and also entrapping the light made incident on the device inside the photovoltaic device by causing multiple interference due to the thin film.

The transparent electrode 906 constituting the upper electrode used in the present invention may preferably have a light transmittance of 85% or more so that the light transmitted from the sun or white fluorescent lamps can be absorbed in the semiconductor layers in a good efficiency. It may also have a sheet resistivity of 100 Ω or less so that it does not electrically serve as a resistance component against the output of the photovoltaic device.

Materials having such properties may include metal oxides such as $SnO_2$, $In_2O_3$, ZnO, CdO, $Cd_2SnO_4$, ITO ($In_2O_3+SnO_2$) and metals such as Au, Al and Cu, which may be formed into very thin and semitransparent films to obtain metal thin films.

In the examples shown in FIGS. 9A to 9C, the transparent electrode is; formed on the second-conductivity type layer 905, and hence materials having a good mutual adhesion must be selected. Such an electrode can be formed by resistance heating vacuum deposition, electron beam heating vacuum deposition, sputtering, spraying or the like, any of which may be selected as desired.

The collector electrode 907 used in the present invention is provided on the transparent electrode 906 so that the surface resistivity of the transparent electrode 906 can be made lower.

Materials for the collector electrode may include thin films of metals such as Ag, Cr, Ni, Al, Ag, Au, Ti, Pt, Cu, Mo and W or alloys of these. Such thin films may be superposingly formed.

The shape and area of the electrode may be appropriately designed so that the amount of light incident on the semiconductor layers can be ensured. For example, the electrode may have such a shape that it uniformly extends over the light-receiving surface of the photovoltaic device and also has an area percentage of 15% or less, and more preferably 10% or less, with respect to the area of the light-receiving surface.

It may also preferably have a sheet resistivity of 50 Ω or less, and more preferably 10 Ω or less.

First- and Second-conductivity Type Layers

As materials used for the first- and second-conductivity type layers in the photovoltaic device of the present invention, non-single-crystal semiconductors comprising one or more atoms belonging to Group IV of the Periodic Table are suitable.

For the conductivity type layer on the side irradiated with light, microcrystallized semiconductors are most suitable. Such microcrystals may have grain diameters of from 3 nm to 20 nm, and most preferably from 3 nm to 10 nm.

In the case when the first- or second-conductivity type layer has an n-type, elements belonging to Group V of the Periodic Table are suitable as additives to be incorporated into the first- or second-conductivity type layer. In particular, phosphorus (P), nitrogen (N), arsenic (As) and antimony (Sb) are most suitable.

In the case when the first- or second-conductivity type layer has a p-type, elements belonging to Group III of the Periodic Table are suitable as additives to be incorporated into the first- or second-conductivity type layer. In particular, boron (B), aluminum (Al) and gallium (Ga) are most suitable.

The first- and second-conductivity type layers may each preferably have a layer thickness of from 1 nm to 50 nm, and most preferably from 3 nm to 10 nm.

In addition, in order to decrease the absorption of light more in the conductivity type layer on the side irradiated with light, it is preferable to use a semiconductor layer having a bandgap larger than the bandgap of the semiconductor constituting the i-type layer. For example, when the i-type layer comprises amorphous silicon, it is most suitable to use non-single-crystal silicon carbide in the conductivity type layer on the side irradiated with light.

i-Type Layer

Semiconductor materials used in the i-type layer in the photovoltaic device of the present invention may include semiconductors comprised of one or more of atoms belonging to Group IV of the Periodic Table, such as Si, Ge, C, SiC, GeC, SiSn, GeSn and SnC. As Group III–V compound semiconductors, they may include GaAs, GaP, GaSb, InP, InAs; as Group II–VI compound semiconductors, ZnSe, ZnS, ZnTe, CdS, CdSe and CdTe; as Group I–III–VI compound semiconductors, $CuAlS_2$, $CuAlSe_2$, $CuAlTe_2$, $CuInSe_2$, $CuInSe_2$, $CuInTe_2$, $CuGaAs_2$, $CuGaSe_2$, $CuGaTe$, $AgInSe_2$, $AgInTe_2$; and as Group II–IV–V compound semiconductors, $ZnSiP_2$, $ZnGeAs_2$, $CdSiAs_2$, $CdSnP_2$; and as oxide semiconductors, $Cu_2O$, $TiO_2$, $In_2O_3$, $SnO_2$, $ZnO$, $CdO$, $Bi_2O_3$ and $CdSnO_4$.

When the photovoltaic devices are produced using the apparatus of the present invention as described above, the problems discussed previously can be solved and also the various requirements stated previously can be satisfied, and photovoltaic devices having a high quality and a good uniformity and having less defects can be produced on the belt-like member continuously transported.

A light-transmittive substrate may be used as the belt-like member 901 so that light is made incident on the substrate side. In such an instance, the electrode 902 may be a transparent electrode formed of ITO or the like, and the second electrode 906 may be formed of a metal.

The apparatus of the present invention for continuously producing photovoltaic devices will be further described below by giving Examples. The present invention is by no means limited by these Examples.

EXAMPLE 1

In the apparatus as shown in FIG. 1, the vacuum chambers 101, 102, 103, 104 and 105 were all fixed to the stand, and then expansion-contraction absorbing members 21 as shown in FIG. 2 were attached to positions between the connecting zones of gas gates and the respective vacuum chambers. Using this apparatus, photovoltaic devices were produced in the following way.

First, a bobbin wound up with a belt-like member 110 made of SUS30BA stainless steel (120 mm wide, 200 m long and 0.13 mm thick) having been well degreased and cleaned and on which a silver thin film 100 nm thick and a ZnO thin film 1 μm thick had been vacuum-deposited as the lower electrode by sputtering was set in a vacuum chamber 101 having a substrate feed mechanism. The belt-like member 110 was passed through a deposition chamber 102 for forming an n-type layer, a deposition chamber 103 for forming an i-type layer and a deposition chamber 104 for forming a p-type layer, up to a vacuum chamber 105 having a belt-like member winding mechanism, and its tension was adjusted so that the belt-like member was not slack.

Now, each vacuum chamber was evacuated to a vacuum of $1 \times 10^{-6}$ Torr or less by means of a vacuum pump (not shown). Next, the gate gas of $H_2$ at 700 sccm was flowed into each gas gate 106, and the belt-like member 110 was heated to 350° C. in the chambers 102, 103 and 104 by means of heating infrared lamps 108. Under conditions as shown in Table 1, n-, i- and p-type layers were formed. Thereafter, ITO and Al were vacuum-deposited to form a transparent electrode and a collector electrode, respectively.

In Table 1, the first-conductivity type layer was an n-type layer, and the second-conductivity type layer was a p-type layer.

The extent of shift of each vacuum chamber, affected by thermal expansion due to the plasma discharge and heating with lamp heaters in the vacuum chambers was measured. Here, the extent of contraction occurring when the expansion-contraction absorbing members 21 (the expansion-contraction absorbing mechanism 107) attached to the respective vacuum chambers were heated was measured regarding as the starting point the position of each member standing at room temperature. Also, since the temperature of each vacuum chamber reached a maximum point immediately before the plasma discharge was stopped and the extent of shift of each vacuum chamber became maximum at that point of time, the maximum extent of contraction of each expansion-contraction absorbing member 21 was defined to be the extent of contraction at this point of time.

As a result of this measurement, the expansion-contraction absorbing members 21 of the vacuum chambers were seen to have shrunk by 5 mm each. When the vacuum chambers were cooled to room temperature, the extent of contraction of these members became zero, and these expansion-contraction absorbing members had returned to their original positions.

COMPARATIVE EXAMPLE 1

The expansion-contraction absorbing members 21 as described above were all detached and the vacuum chambers were all fixed to the stand, where photovoltaic devices (Comp. 1 devices) were produced under entirely the same film-forming conditions as in Example 1.

The extent of shift of each vacuum chamber, affected by thermal expansion due to the plasma discharge in each vacuum chamber and the heating with lamp heaters was measured in the same manner as in Example 1.

It was just like Example 1 that the temperature of each vacuum chamber reached a maximum point immediately before the plasma discharge was stopped. However, while in Example 1 the extent of contraction of each expansion-contraction absorbing member 21 reached a maximum (5 mm) at this point of time, the extent of shift of each vacuum chamber in this Comparative Example 1 was, as a result of measurement, 0.5 mm in respect of the vacuum chambers 102 and 104 and 1 mm in respect of the vacuum chambers 101 and 105, which respectively shifted in the direction they went away from the vacuum chamber 103 provided at the middle.

When the vacuum chambers were well cooled to room temperature, the extent of shift of these chambers became zero, and the respective vacuum chambers returned to their original positions.

EVALUATION ON EXAMPLE 1 AND COMPARATIVE EXAMPLE 1

The uniformity of characteristics and density of defects in the photovoltaic devices produced in Example 1 (Ex. 1 devices) and Comparative Example 1 (Comp. 1 devices) were evaluated.

To evaluate the uniformity of characteristics, the photovoltaic devices produced in Example 1 (Ex. 1 devices) and Comparative Example 1 (Comp. 1 devices), formed on the belt-like member, were cut out at intervals of 10 m in a size 5 cm square, and placed under irradiation with light of AM-1.5 (100 mW/cm$^2$) to measure their photoelectric conversion efficiency. Any scattering of the measurement results of the photoelectric conversion efficiency was examined. Regarding the results on the photovoltaic devices of Comparative Example 1 (Comp. 1 devices) as a standard, reciprocals of the degree of scattering were calculated to obtain the results as shown in Table 2.

To evaluate the defect density, 100 pieces of the photovoltaic devices produced in Example 1 (Ex. 1 devices) and Comparative Example 1 (Comp. 1 devices), formed on the belt-like member, were cut out in a size 5 cm square within the length 5 m at the middle portion thereof, and electric currents in the reverse direction were measured to detect the presence or absence of defects (imperfections) in the respective photovoltaic devices. Regarding the results on the photovoltaic devices of Comparative Example 1 (Comp. 1 devices) as a standard, reciprocals of the number of defects were calculated to obtain the results as shown in Table 2.

It can be said that the higher the numerical values of these are, the better the solar cells (photovoltaic devices) are on the whole in respect of both the defect density and the uniformity of characteristics.

In Table 2, the uniformity of characteristics and defect density are indicated as relative values with respect to those of Comparative Example 1 regarded as a standard.

As is seen from Table 2, the photovoltaic devices of Example 1 (Ex. 1 devices) show good results with respect to both the uniformity of characteristics and the defect density, compared with the photovoltaic devices of Comparative Example 1 (Comp. 1 devices), proving that the present invention is effective.

EXAMPLE 2

Tandem type solar cells (photovoltaic devices) as shown in FIG. 9B were produced, having two sets of pin junctions comprised of a first-conductivity type layer, an i-type layer, a second-conductivity type layer, a first-conductivity type layer, an i-type layer and a second-conductivity type layer which were superposed on the lower electrode.

The i-type layers were respectively formed of amorphous silicon germanium in the first pin junction, and amorphous silicon in the second pin junction.

The photovoltaic devices were produced under conditions as shown together in Table 3.

In Table 3, the first-conductivity type layer was an n-type layer, and the second-conductivity type layer was a p-type layer. Layers were superposed in the order of the upper to lower columns as shown in the table.

In the present Example, the vacuum chambers for forming semiconductor layers were all fixed to the stand, and then expansion-contraction absorbing members 21 as shown in FIG. 2 were attached to positions between the connecting zones between gas gates and the respective vacuum chambers, thus the photovoltaic devices were produced.

Using the apparatus set up in this way, the tandem type solar cells were produced according to the same process for producing photovoltaic devices as in Example 1.

The extent of contraction of each expansion-contraction absorbing member, affected by thermal expansion due to the plasma discharge and heating with lamp heaters in the vacuum chambers was measured in the same manner as in Example 1. Here, the extent of shift occurring when the vacuum chambers were heated was measured regarding as the starting point the position of each vacuum chamber standing at room temperature. Also, the temperature of each vacuum chamber reached a maximum point immediately before the plasma discharge was stopped and the extent of shift of each vacuum chamber reached a maximum at that point of time, where the extent of contraction of each expansion-contraction absorbing member also reached maximum.

As a result of this measurement, the expansion-contraction absorbing members provided between the vacuum chambers and the connecting members (gas gates) were all seen to have shrunk by 5 mm each.

When the vacuum chambers were cooled to room temperature, the extent of contraction of these members became zero, and these expansion-contraction absorbing members returned to their original positions.

COMPARATIVE EXAMPLE 2

The expansion-contraction absorbing members 21 as described above were all detached and the vacuum chambers were all fixed to the stand, where photovoltaic devices (Comp. 2 devices) were produced under entirely the same film-forming conditions as in Example 2.

The extent of shift of each vacuum chamber, affected by thermal expansion due to the plasma discharge in each vacuum chamber and the heating with lamp heaters was measured in the same manner as in Example 2.

It was just like Example 2 that the temperature of each vacuum chamber reached a maximum point immediately before the plasma discharge was stopped. However, while in Example 2 the extent of contraction of each expansion-contraction absorbing member, i.e., the extent of shift of each vacuum chamber became maximum (5 mm) at this point of time, the extent of shift of each vacuum chamber in this Comparative Example 2 was, as a result of measurement, about 0.5 mm in respect of all the vacuum chambers.

When the vacuum chambers were well cooled to room temperature, the extent of shift of these chambers became zero, and the respective vacuum chambers were seen to have returned to original positions.

EVALUATION ON EXAMPLE 2 AND COMPARATIVE EXAMPLE 2

The uniformity of characteristics and density of defects in the photovoltaic devices produced in Example 2 (Ex. 2 devices) and Comparative Example 2 (Comp. 2 devices) were evaluated.

To evaluate the uniformity of characteristics, the photovoltaic devices produced in Example 2 (Ex. 2 devices) and Comparative Example 2 (Comp. 2 devices), formed on the belt-like member, were cut out at intervals of 10 m in a size 5 cm square, and placed under irradiation by light of AM-1.5 (100 mW/cm$^2$) to measure their photoelectric conversion efficiency. Any scattering of the measurement results of the photoelectric conversion efficiency was examined. Regarding the results on the photovoltaic devices of Comparative Example 2 (Comp. 2 devices) as a standard, reciprocals of the degree of scattering were calculated to obtain the results as shown in Table 4.

To evaluate the defect density, 100 pieces of the photovoltaic devices produced in Example 2 (Ex. 2 devices) and Comparative Example 2 (Comp. 2 devices), formed on the belt-like member, were cut out in a size 5 cm square within the length 5 m at the middle portion thereof, and electric currents in the reverse direction were measured to detect the presence or absence of defects (imperfections) in the respective photovoltaic devices. Regarding the results on the photovoltaic devices of Comparative Example 2 (Comp. 2 devices) as a standard, reciprocals of the number of defects were calculated to obtain the results as shown in Table 4.

In Table 4, the uniformity of characteristics and defect density are indicated as relative values with respect to those of Comparative Example 2 regarded as a standard.

As is seen from Table 4, the photovoltaic devices of Example 2 (Ex. 2 devices) show good results with respect to both the uniformity of characteristics and the defect density, compared with the photovoltaic devices of Comparative Example 2 (Comp. 2 devices), proving that the present invention is effective.

EXAMPLE 3

Triple type photovoltaic devices as shown in FIG. 9C were produced, having three sets of pin junctions of first-conductivity type layers, i-type layers and second-conductivity type layers which were superposed on the lower electrode.

The i-type layers were respectively formed of amorphous silicon germanium in the first pin junction, amorphous silicon germanium in the second pin junction, and amorphous silicon in the third pin junction.

The photovoltaic devices were produced under conditions as shown together in Table 5.

In Table 5, the first-conductivity type layer was an n-type layer, and the second-conductivity type layer was a p-type layer. Layers were superposed in the order of the upper to lower columns as shown in the table.

In the present Example, the vacuum chambers for forming semiconductor layers were all fixed to the stand, and then expansion-contraction absorbing members as shown in FIG. 3B were attached to the connecting zones between gas gates and the respective vacuum chambers, thus the photovoltaic devices were produced.

Using the apparatus set up in this way, the triple type solar cells were produced according to the same process for producing photovoltaic devices as in Example 2.

The extent of contraction of each expansion-contraction absorbing member, affected by thermal expansion due to the plasma discharge and heating with lamp heaters in the vacuum chambers was measured in the same manner as in Example 1. Here, the extent of shift occurring when the vacuum chambers were heated was measured regarding as the starting point the position of each vacuum chamber standing at room temperature. Also, the temperature of each vacuum chamber reached a maximum point immediately before the plasma discharge was stopped and the extent of shift of each vacuum chamber became maximum at that point of time, where the extent of contraction of each expansion-contraction absorbing member also became maximum.

As a result of this measurement, the expansion-contraction absorbing members provided between the vacuum chambers and the connecting members (gas gates) were all seen to have shrunk by 5 mm each. When the vacuum chambers were cooled to room temperature, the extent of contraction of these members became zero, and these expansion-contraction absorbing members returned to their original positions.

COMPARATIVE EXAMPLE 3

The expansion-contraction absorbing members as used in Example 3 were all detached and the vacuum chambers were all fixed to the stand, where photovoltaic devices (Comp. 3 devices) were produced under entirely the same film-forming conditions as in Example 3.

The extent of shift of each vacuum chamber, affected by thermal expansion due to the plasma discharge in each vacuum chamber and the heating with lamp heaters was measured in the same manner as in Example 1.

It was just like Example 3 that the temperature of each vacuum chamber reached a maximum point immediately before the plasma discharge was stopped. However, while in Example 3 the extent of contraction of each expansion-contraction absorbing member, i.e., the extent of shift of each vacuum chamber reached a maximum (5 mm) at this point of time, the extent of shift of each vacuum chamber in this Comparative Example 3 was, as a result of measurement, about 0.5 mm or about 0.6 mm even at the maximum in respect of all the vacuum chambers.

When the vacuum chambers were cooled to room temperature, the extent of shift of these chambers became zero, and the respective vacuum chambers returned to their original positions.

EVALUATION ON EXAMPLE 3 AND COMPARATIVE EXAMPLE 3

The uniformity of characteristics and density of defects in the photovoltaic devices produced in Example 3 (Ex. 3 devices) and Comparative Example 3 (Comp. 3 devices) were evaluated.

To evaluate the uniformity of characteristics, the photovoltaic devices produced in Example 3 (Ex. 3 devices) and Comparative Example 3 (Comp. 3 devices), formed on the belt-like member, were cut out at intervals 10 m in a size 5 cm square, and placed under irradiation by light of AM-1.5 (100 mW/cm$^2$) to measure their photoelectric conversion efficiency. Any scattering of the measurement results of the photoelectric conversion efficiency was examined. Regarding the results on the photovoltaic devices of Comparative Example 3 (Comp. 3 devices) as a standard, reciprocals of the degree of scattering were calculated to obtain the results as shown in Table 6.

To evaluate the defect density, 100 pieces of the photovoltaic devices produced in Example 3 (Ex. 3 devices) and Comparative Example 3 (Comp. 3 devices), formed on the belt-like member, were cut out in a size 5 cm square within the length 5 m at the middle portion thereof, and electric currents in the reverse direction were measured to detect the presence or absence of defects (imperfections) in the respective photovoltaic devices. Regarding the results on the photovoltaic devices of Comparative Example 3 (Comp. 3 devices) as a standard, reciprocals of the number of defects were calculated to obtain the results as shown in Table 6.

In Table 6, the uniformity of characteristics and defect density are indicated as relative values with respect to those of Comparative Example 3 regarded as a standard.

As is seen from Table 6, the photovoltaic devices of Example 3 (Ex. 3 devices) show good results with respect to both the uniformity of characteristics and the defect density, compared with the photovoltaic devices of Comparative Example 3 (Comp. 3 devices), proving that the present invention is effective.

EXAMPLE 4

An example will be described below in which the photovoltaic devices are produced while making up film-forming space by bending the belt-like member in a cylindrical form in its transport direction inside the deposition chambers 102, 103 and 104 shown in FIG. 1.

In FIG. 10, reference numeral 1001 denotes a belt-like member, which is transported in the direction of a wide arrow shown in FIG. 10, and continuously makes up film-forming space 1016 while keeping a cylindrically curved shape by means of a supporting-transporting roller 1002 and 1003 and supporting-transporting rings 1004 and 1005.

Reference numerals 1006a to 1006e denote members constituting a temperature control mechanism for heating or cooling the belt-like member 1001, which are each independently temperature-controlled. In the present apparatus, microwave applicators 1007 and 1008 are opposingly provided in pair. At end portions thereof, microwave transmitting members 1009 and 1010 are respectively provided, and rectangular waveguides 1011 and 1012 are also respectively provided in such a way that the planes containing their long sides are not vertical with respect to the planes containing the axes of the supporting-transporting rollers and also the planes containing the long sides are not parallel to each other.

In FIG. 10, for the purpose of illustration, the microwave applicator 1007 is shown in the state it is separated from the supporting-transporting ring 1004. When deposited films are formed, it is provided in the direction of a fine arrow shown in FIG. 10.

Reference numerals 1013a, 1013b and 1013c denote gas feed means, through which material gases are introduced into the film-forming space by means of gas feed equipment (not shown). The supporting-transporting rollers 1002 and 1003 are each internally provided with a transport speed detecting mechanism (not shown) and a tension detecting control mechanism (not shown) so that the transport speed of the belt-like member 1001 can be kept constant and also the curved shape thereof can be kept constant.

Using this microwave CVD apparatus, photovoltaic devices were produced under conditions as shown in Table 7.

In Table 7, the first-conductivity type layer was an n-type layer, and the second-conductivity type layer was a p-type layer. Layers were superposed in the order of the upper to lower columns as shown in the table.

In the present Example, the vacuum chambers for forming semiconductor layers were all fixed to the stand, and then expansion-contraction absorbing members 21 as shown in FIG. 2 were attached to positions between the connecting zones between gas gates and the respective vacuum chambers, thus the photovoltaic devices were produced.

The extent of contraction of each expansion-contraction absorbing member, affected by thermal expansion due to the plasma discharge and heating with lamp heaters in the vacuum chambers was measured in the same manner as in Example 1. Here, the extent of contraction occurring when the expansion-contraction absorbing members attached to the respective vacuum chambers were heated was measured regarding as the starting point the position of each member standing at room temperature. Also, since the temperature of each vacuum chamber reached a maximum point immediately before the plasma discharge was stopped and the extent of shift of each vacuum chamber became maximum at that point of time, the maximum extent of contraction of each expansion-contraction absorbing member was defined to be the extent of contraction at this point of time.

As a result of this measurement, the expansion-contraction absorbing members of the vacuum chambers were seen to have shrunk by 5 mm each. When the vacuum chambers were cooled to room temperature, the extent of contraction of these members became zero, and these expansion-contraction absorbing members returned to their original positions.

COMPARATIVE EXAMPLE 4

The expansion-contraction absorbing members as used in Example 4 were all detached and the vacuum chambers were all fixed to the stand, where photovoltaic devices (Comp. 4 devices) were produced under entirely the same film-forming conditions as in Example 4.

The extent of shift of each vacuum chamber, affected by thermal expansion due to the plasma discharge in each vacuum chamber and the heating with lamp heaters was measured in the same manner as in Example 4.

It was just like Example 4 that the temperature of each vacuum chamber reached a maximum point immediately before the plasma discharge was stopped. However, while in Example 4 the extent of contraction of each expansion-contraction absorbing member reached maximum (5 mm) at this point of time, the extent of shift of each vacuum chamber in this Comparative Example 4 was, as a result of measurement, 0.5 mm in respect of the vacuum chambers 102 and 104 and 1 mm in respect of the vacuum chambers 101 and 105, which respectively shifted in the direction they went away from the vacuum chamber 103 provided at the middle.

When the vacuum chambers were cooled to room temperature, the extent of shift of these chambers became zero, and the respective vacuum chambers returned to their original positions.

EVALUATION ON EXAMPLE 4 AND COMPARATIVE EXAMPLE 4

The uniformity of characteristics and density of defects in the photovoltaic devices produced in Example 4 (Ex. 4 devices) and Comparative Example 4 (Comp. 4 devices) were evaluated.

To evaluate the uniformity of characteristics, the photovoltaic devices produced in Example 4 (Ex. 4 devices) and Comparative Example 4 (Comp. 4 devices), formed on the belt-like member, were cut out at intervals of 10 m in a size 5 cm square, and placed under irradiation by light of AM-1.5 (100 mW/cm$^2$) to measure their photoelectric conversion efficiency. Any scattering of the measurement results of the photoelectric conversion efficiency was examined. Regarding the results on the photovoltaic devices of Comparative Example 4 (Comp. 4 devices) as a standard, reciprocals of the degree of scattering were calculated to obtain the results as shown in Table 8.

To evaluate the defect density, 100 pieces of the photovoltaic devices produced in Example 4 (Ex. 4 devices) and Comparative Example 4 (Comp. 4 devices), formed on the belt-like member, were cut out in a size 5 cm square within the length 5 m at the middle portion thereof, and electric currents in the reverse direction were measured to detect the presence or absence of defects (imperfections) in the respective photovoltaic devices. Regarding the results on the photovoltaic devices of Comparative Example 4 (Comp. 4 devices) as a standard, reciprocals of the number of defects were calculated to obtain the results as shown in Table 8.

In Table 8, the uniformity of characteristics and defect density are indicated as relative values with respect to those of Comparative Example 4 regarded as a standard.

As is seen from Table 8, the photovoltaic devices of Example 4 (Ex. 4 devices) show good results with respect to both the uniformity of characteristics and the defect density, compared with the photovoltaic devices of Comparative Example 4 (Comp. 4 devices), proving that the present invention is effective.

In the following Examples, instances where sliding members as the sliding mechanism are provided to vacuum chambers will be described.

EXAMPLE 5

In the apparatus as shown in FIG. 1, in place of the expansion-contraction absorbing members 107, the sliding members as shown in FIG. 4 were attached to four corners at the bottoms of the vacuum chambers 101, 102, 104 and 105, and photovoltaic devices were produced in the state these vacuum chambers are readily shiftable on the stand.

The photovoltaic devices were produced under conditions as shown together in Table 9.

In Table 9, the first-conductivity type layer was an n-type layer, and the second-conductivity type layer was a p-type layer.

The extent of shift of each vacuum chamber, affected by thermal expansion due to the plasma discharge and heating with lamp heaters in the vacuum chambers was measured in the same manner as in Example 1. Here, the extent of shift occurring when the vacuum chambers were heated was measured regarding as the starting point the position of each vacuum chamber standing at room temperature. Also, since the temperature of each vacuum chamber reached a maximum point immediately before the plasma discharge was stopped and the extent of shift of each vacuum chamber reached maximum at that point of time, the maximum extent of shift of each vacuum chamber was defined to be the extent of shift at this point of time. As a result of this measurement, the extent of shift was 5 mm in respect of the vacuum chambers 102 and 104 and 10 mm in respect of the vacuum chambers 101 and 105, which respectively shifted in the direction they went away from the vacuum chamber 103 provided at the middle.

When the vacuum chambers were cooled to room temperature, the extent of shift of these chambers became zero, and the respective vacuum chambers returned to their original positions.

COMPARATIVE EXAMPLE 5

The sliding members as used in Example 5 were all detached and the vacuum chambers were all fixed to the stand, where photovoltaic devices (Comp. 5 devices) were produced under entirely the same film-forming conditions as in Example 5.

The extent of shift of each vacuum chamber, affected by thermal expansion due to the plasma discharge in each vacuum chamber and the heating with lamp heaters was measured in the same manner as in Example 5.

It was just like Example 5 that the temperature of each vacuum chamber reached a maximum point immediately before the plasma discharge was stopped. However, while in Example 5 the extent of shift of each vacuum chamber reached a maximum (5 mm or 10 mm) at this point in time, the extent of shift of each vacuum chamber in this Comparative Example 5 was, as a result of measurement, 0.5 mm in respect of the vacuum chambers 102 and 104 and 1 mm in respect of the vacuum chambers 101 and 105, which respectively shifted in the direction they went away from the vacuum chamber 103 provided at the middle.

When the vacuum chambers were cooled to room temperature, the extent of shift of these chambers became zero, and the respective vacuum chambers returned to their original positions.

EVALUATION ON EXAMPLE 5 AND COMPARATIVE EXAMPLE 5

The uniformity of characteristics and density of defects in the photovoltaic devices produced in Example 5 (Ex. 5 devices) and Comparative Example 5 (Comp. 5 devices) were evaluated.

To evaluate the uniformity of characteristics, the photovoltaic devices produced in Example 5 (Ex. 5 devices) and Comparative Example 5 (Comp. 5 devices), formed on the belt-like member, were cut out at intervals of 10 m in a size 5 cm square, and placed under irradiation by light of AM-1.5 (100 mW/cm$^2$) to measure their photoelectric conversion efficiency. Any scattering of the measurement results of the photoelectric conversion, efficiency was examined. Regarding the results on the photovoltaic devices of Comparative Example 5 (Comp. 5 devices) as a standard, reciprocals of the degree of scattering were calculated to obtain the results as; shown in Table 10.

To evaluate the defect density, 100 pieces of the photovoltaic devices produced in Example 5 (Ex. 5 devices) and Comparative Example 5 (Comp. 5 devices), formed on the belt-like member, were cut out in a size of 5 cm square within the length of 5 m at the middle portion thereof, and electric currents in the reverse direction were measured to detect the presence or absence of defects (imperfections) in the respective photovoltaic devices. Regarding the results on the photovoltaic devices of Comparative Example 5 (Comp. 5 devices) as a standard, reciprocals of the number of defects were calculated to obtain the results as shown in Table 10.

It can be said that the higher the numerical values are, the better the solar cells (photovoltaic devices) are on the whole with respect to both the defect density and the uniformity of characteristics.

In Table 10, the uniformity of characteristics and defect density are indicated as relative values with respect to those of Comparative Example 5 regarded as a standard.

As is seen from Table 10, the photovoltaic devices of Example 5 (Ex. 5 devices) show good results in respect of both the uniformity of characteristics and the defect density, compared with the photovoltaic devices of Comparative Example 5 (Comp. 5 devices), proving that the present invention is effective.

EXAMPLE 6

Tandem type solar cells (photovoltaic devices) as shown in Table 9 were produced, having two sets of pin junctions comprised of a first-conductivity type layer, an i-type layer, a second-conductivity type layer, a first-conductivity type layer, an i-type layer and a second-conductivity type layer which were superposed on the lower electrode.

The i-type layers were respectively formed of amorphous silicon germanium in the first pin junction, and amorphous silicon in the second pin junction.

The photovoltaic devices were produced under conditions as shown together in Table 11.

In Table 11, the first-conductivity type layer was an n-type layer, and the second-conductivity type layer was a p-type layer. Layers were superposed in the order of the upper to lower columns as shown in the table.

In the present Example, eight vacuum chambers were provided in total.

In the case of this Example, the vacuum chambers were fixed in the following way: The middle vacuum chamber for forming the p-type layer was fixed to the stand only at one side of the bottom corners of the chamber, and the sliding members as shown in FIG. 6 were attached to the other bottom two corners of the middle vacuum chamber and also to the bottom four corners of the remaining vacuum chambers.

Using the apparatus set up in this way, the tandem type solar cells were produced according to the same process for producing photovoltaic devices as in Example 5.

The extent of shift of each vacuum chamber, affected by thermal expansion due to the plasma discharge and heating with lamp heaters in the vacuum chambers was measured in the same manner as in Example 5. Here, the extent of shift occurring when the vacuum chambers were heated was; measured regarding as the starting point the position of each vacuum chamber standing at room temperature. Also, since the temperature of each vacuum chamber reached a maximum point immediately before the plasma discharge was stopped and the extent of shift of each vacuum chamber became maximum at that point in time, the maximum extent of shift of each vacuum chamber was defined to be the extent of shift at this point in time.

As a result of this measurement, the extent of shift of the eight vacuum chambers was 20 mm, 15 mm, 10 mm, 5 mm, 5 mm, 10 mm, 15 mm and 20 mm, respectively, in the order starting from the substrate feed chamber, which respectively shifted in the direction they went away from the fixed position.

When the vacuum chambers were cooled to room temperature after a series of production steps were completed, the extent of shift of these chambers became zero, and these vacuum chambers returned to their original positions.

COMPARATIVE EXAMPLE 6

The sliding members as used in Example 6 were all detached and the vacuum chambers were all fixed to the stand, where photovoltaic devices (Comp. 6 devices) were produced under entirely the same film-forming conditions as in Example 6.

The extent of shift of each vacuum chamber, affected by thermal expansion due to the plasma discharge in each vacuum chamber and the heating with lamp heaters was measured in the same manner as in Example 6.

It was just like Example 6 that the temperature of each vacuum chamber reached a maximum point immediately before the plasma discharge was stopped. However, while in Example 6 the extent of shift of each vacuum chamber became maximum at this point of time, the extent of shift of each vacuum chamber in this Comparative Example 6 was, as a result of measurement, about 0.5 mm in respect of all the vacuum chambers.

When the vacuum chambers were well cooled to room temperature, the extent of shift of these chambers became zero, and the respective vacuum chambers were seen to have returned to original positions.

EVALUATION ON EXAMPLE 6 AND COMPARATIVE EXAMPLE 6

The uniformity of characteristics and density of defects in the photovoltaic devices produced in Example 6 (Ex. 6 devices) and Comparative Example 6 (Comp. 6 devices) were evaluated.

To evaluate the uniformity of characteristics, the photovoltaic devices produced in Example 6 (Ex. 6 devices) and Comparative Example 6 (Comp. 6 devices), formed on the belt-like member, were cut out at intervals 10 m in a size of 5 cm square, and placed under irradiation by light of AM-1.5 (100 mW/cm$^2$) to measure their photoelectric conversion efficiency. Any scattering of the measurement results of the photoelectric conversion efficiency was examined. Regarding the results on the photovoltaic devices of Comparative Example 6 (Comp. 6 devices) as a standard, reciprocals of the degree of scattering were calculated to obtain the results as shown in Table 12.

To evaluate the defect density, 100 pieces of the photovoltaic devices produced in Example 6 (Ex. 6 devices) and Comparative Example 6 (Comp. 6 devices), formed on the belt-like member, were cut out in a size 5 cm square within the length 5 m at the middle portion thereof, and electric currents in the reverse direction were measured to detect the presence or absence of defects (imperfections) in the respective photovoltaic devices. Regarding the results on the photovoltaic devices of Comparative Example 6 (Comp. 6 devices) as a standard, reciprocals of the number of defects were calculated to obtain the results as shown in Table 12.

In Table 12, the uniformity of characteristics and defect density are indicated as relative values with respect to those of Comparative Example 6 regarded as a standard.

As is seen from Table 12, the photovoltaic devices of Example 6 (Ex. 6 devices) show good results with respect of both the uniformity to characteristics and the defect density, compared with the photovoltaic devices of Comparative Example 6 (Comp. 6 devices), proving that the present invention is effective.

EXAMPLE 7

Triple type photovoltaic devices as shown in FIG. 9C were produced, having three sets of pin junctions of first-conductivity type layers, i-type layers and second-conductivity type layers which were superposed on the lower electrode.

The i-type layers were respectively formed of amorphous silicon germanium in the first pin junction, amorphous silicon germanium in the second pin junction, and amorphous silicon in the third pin junction.

The photovoltaic devices were produced under conditions as shown together in Table 13.

In Table 13, the first-conductivity type layer was an n-type layer, and the second-conductivity type layer was a p-type layer. Layers were superposed in the order of the upper to lower columns as shown in the table.

In the present Example, eleven vacuum chambers in total were provided.

In the case of this Example, the middle-positioned vacuum chamber was the i-type layer forming vacuum chamber at the middle. The sliding members as shown in FIG. 6 were attached to the bottom four corners of each vacuum chamber.

Using the apparatus set up in this way, the triple type solar cells were produced according to the same process for producing photovoltaic devices as in Example 6.

The extent of shift of each vacuum chamber, affected by thermal expansion due to the plasma discharge and heating with lamp heaters in the vacuum chambers was measured in the same manner as in Example 6. Here, the extent of shift occurring when the vacuum chambers were heated was measured regarding as the starting point the position of each vacuum chamber standing at room temperature. Also, since the temperature of each vacuum chamber reached a maximum point immediately before the plasma discharge was stopped and the extent of shift of each vacuum chamber reached a maximum at that point of time, the maximum extent of shift of each vacuum chamber was defined to be the extent of shift at this point of time.

As a result of this measurement, it was seen that, among the eleven vacuum chambers, the middle i-type layer forming vacuum chamber did not shift and the remaining vacuum chambers respectively shifted by 25 mm, 20 mm, 15 mm, 10 mm and 5 mm in the order of vacuum chambers distant from the middle vacuum chamber.

When the vacuum chambers were cooled to room temperature after a series of production steps were completed, the extent of shift of these chambers became zero, and these vacuum chambers returned to their original positions.

COMPARATIVE EXAMPLE 7

The sliding members as used in Example 7 were all detached and the vacuum chambers were all fixed to the stand, where photovoltaic devices (Comp. 7 devices) were produced under entirely the same film-forming conditions as in Example 7.

The extent of shift of each vacuum chamber, affected by thermal expansion due to the plasma discharge in each vacuum chamber and the heating with lamp heaters was measured in the same manner as in Example 7.

It was just like Example 7 that the temperature of each vacuum chamber reached a maximum point immediately before the plasma discharge was stopped. However, while in Example 7 the extent of shift of each vacuum chamber became maximum at this point of time, the extent of shift of each vacuum chamber in this Comparative Example 7 was, as a result of measurement, about 0.5 mm, or about 0.6 mm even at maximum, in respect of all the vacuum chambers.

When the vacuum chambers were cooled to room temperature, the extent of shift of these chambers became zero, and the respective vacuum chambers returned to their original positions.

EVALUATION ON EXAMPLE 7 AND COMPARATIVE EXAMPLE 7

The uniformity of characteristics and density of defects in the photovoltaic devices produced in Example 7 (Ex. 7 devices) and Comparative Example 7 (Comp. 7 devices) were evaluated.

To evaluate the uniformity of characteristics, the photovoltaic devices produced in Example 7 (Ex. 7 devices) and Comparative Example 7 (Comp. 7 devices), formed on the belt-like member, were cut out at intervals of 10 m in a size 5 cm square, and placed under irradiation by light of AM-1.5 (100 mW/cm$^2$) to measure their photoelectric conversion efficiency. Any scattering of the measurement results of the photoelectric conversion efficiency was examined. Regarding the results on the photovoltaic devices of Comparative Example 7 (Comp. 7 devices) as a standard, reciprocals of the degree of scattering were calculated to obtain the results as shown in Table 14.

To evaluate the defect density, 100 pieces of the photovoltaic devices produced in Example 7 (Ex. 7 devices) and Comparative Example 7 (Comp. 7 devices), formed on the belt-like member, were cut out in a size 5 cm square within the length 5 m at the middle portion thereof, and electric currents in the reverse direction were measured to detect the presence or absence of defects (imperfections) in the respective photovoltaic devices. Regarding the results on the photovoltaic devices of Comparative Example 7 (Comp. 7 devices) as a standard, reciprocals of the number of defects were calculated to obtain the results as shown in Table 14.

In Table 14, the uniformity of characteristics and defect density are indicated as relative values with respect to those of Comparative Example 7 regarded as a standard.

As is seen from Table 14, the photovoltaic devices of Example 7 (Ex. 7 devices) show good results with respect to both the uniformity of characteristics and the defect density, compared with the photovoltaic devices of Comparative Example 7 (Comp. 7 devices), proving that the present invention is effective.

EXAMPLE 8

In the apparatus as shown in FIG. 1, vacuum chambers provided with the sliding mechanism as shown in FIG. 7 were used in place of those provided with the expansion-contraction absorbing members 107, and also the method as used in Example 4 was used in which the belt-like member was bent in a cylindrical form to make up film-forming space.

The photovoltaic devices were produced under conditions as shown together in Table 15.

In Table 15, the first-conductivity type layer was an n-type layer, and the second-conductivity type layer was a p-type layer. Layers were superposed in the order of the upper to lower columns as shown in the table.

The extent of shift of each vacuum chamber, affected by thermal expansion due to the plasma discharge and heating with lamp heaters in the vacuum chambers was measured in the same manner as in Example 1. Here, the extent of shift occurring when the vacuum chambers were heated was measured regarding as the starting point the position of each vacuum chamber standing at room temperature. Also, since the temperature of each vacuum chamber reached a maximum point immediately before the plasma discharge was stopped and the extent of shift of each vacuum chamber reached maximum at that point of time, the maximum extent of shift of each vacuum chamber was defined to be the extent of shift at this point of time. As a result of this measurement, the extent of shift was 5 mm in respect of the vacuum chambers 102 and 104 and 10 mm in respect of the vacuum chambers 101 and 105, which respectively shifted in the direction they went away from the vacuum chamber 103 provided at the middle.

When the vacuum chambers were cooled to room temperature, the extent of shift of these chambers became zero, and the respective vacuum chambers returned to their original positions.

COMPARATIVE EXAMPLE 8

The sliding members and slide limiting members as used in Example 8 were all detached and the vacuum chambers were all fixed to the stand, where photovoltaic devices (Comp. 8 devices) were produced under entirely the same film-forming conditions as in Example 8.

The extent of shift of each vacuum chamber, affected by thermal expansion due to the plasma discharge in each vacuum chamber and the heating with lamp heaters was measured in the same manner as in Example 8.

It was just like Example 8 that the temperature of each vacuum chamber reached a maximum point immediately before the plasma discharge was stopped. However, while in Example 8 the extent of shift of each vacuum chamber became maximum at this point of time, the extent of shift of each vacuum chamber in this Comparative Example 8 was, as a result of measurement, 0.5 mm in respect of the vacuum chambers 102 and 104 and 1 mm in respect of the vacuum chambers 101 and 105, which respectively shifted in the direction they went away from the vacuum chamber 103 provided at the middle.

When the vacuum chambers were cooled to room temperature, the extent of shift of these chambers became zero, and the respective vacuum chambers returned to their original positions.

EVALUATION ON EXAMPLE 8 AND COMPARATIVE EXAMPLE 8

The uniformity of characteristics and density of defects in the photovoltaic devices produced in Example 8 (Ex. 8 devices) and Comparative Example 8 (Comp. 8 devices) were evaluated.

To evaluate the uniformity of characteristics, the photovoltaic devices produced in Example 8 (Ex. 8 devices) and Comparative Example 8 (Comp. 8 devices), formed on the belt-like member, were cut out at intervals of 10 m in a size 5 cm square, and placed under irradiation by light of AM-1.5 (100 mW/cm$^2$) to measure their photoelectric conversion efficiency. Any scattering of the measurement results of the photoelectric conversion efficiency was examined. Regarding the results on the photovoltaic devices of Comparative Example 8 (Comp. 8 devices) as a standard, reciprocals of the degree of scattering were calculated to obtain the results as shown in Table 16.

To evaluate the defect density, 100 pieces of the photovoltaic devices produced in Example 8 (Ex. 8 devices) and Comparative Example 8 (Comp. 8 devices), formed on the belt-like member, were cut out in a size 5 cm square within the length 5 m at the middle portion thereof, and electric currents in the reverse direction were measured to detect the presence or absence of defects (imperfections) in the respective photovoltaic devices. Regarding the results on the photovoltaic devices of Comparative Example 8 (Comp. 8 devices) as a standard, reciprocals of the number of defects were calculated to obtain the results as shown in Table 16.

In Table 16, the uniformity of characteristics and defect density are indicated as relative values with respect to those of Comparative Example 8 regarded as a standard.

As is seen from Table 16, the photovoltaic devices of Example 8 (Ex. 8 devices) show good results with respect of both the uniformity to characteristics and the defect density, compared with the photovoltaic devices of Comparative Example 8 (Comp. 8 devices), proving that the present invention is effective.

TABLE 1

Substrate:
SUS430BA; width: 120 mm; thickness: 0.13 mm
Reflecting layer:
Silver (Ag), 100 nm thin film
Reflection enhancing layer:
Zinc oxide (ZnO), 1 μm thin film
Gate gas:
H$_2$ from each gate, 700 sccm
Layer-forming conditions:

| Gases used; flow rate (sccm) | Microwave power (W) | Pressure (mTorr) | Substrate temp. (° C.) |
|---|---|---|---|
| Layers n-Type layer: | | | |
| SiH$_4$ 20 PH$_3$/H$_2$ 100 (1% diluted) H$_2$ 200 | 1,000 | 30 | 300 |
| i-Type layer: | | | |
| SiH$_4$ 200 H$_2$ 100 | 300 | 6 | 300 |

TABLE 1-continued

Substrate:
SUS430BA; width: 120 mm; thickness: 0.13 mm
Reflecting layer:
Silver (Ag), 100 nm thin film
Reflection enhancing layer:
Zinc oxide (ZnO), 1 μm thin film
Gate gas:
H$_2$ from each gate, 700 sccm
Layer-forming conditions:

| Gases used; flow rate (sccm) | Microwave power (W) | Pressure (mTorr) | Substrate temp. (° C.) |
|---|---|---|---|
| p-Type layer: | | | |
| SiH$_4$ 10 BF$_3$/H$_2$ 50 (1% diluted) H$_2$ 250 | 1,000 | 30 | 300 |

Transparent electrode: ITO(In$_2$O$_3$ + SnO$_2$), 70 nm thin film
Collector electrode: aluminum (Al), 2 μm thin film

TABLE 2

| Device No. | Uniformity of characteristics | Defect density |
|---|---|---|
| Ex. 1 | 1.11 | 1.32 |
| Comp. 1 | 1.00 | 1.00 |

TABLE 3

Layer-forming conditions:

| Gases used; flow rate (sccm) | Microwave power (W) | pressure (mTorr) | Substrate temp. (° C.) |
|---|---|---|---|
| Layers n-Type layer: | | | |
| SiH$_4$ 20 PH$_3$/H$_2$ 100 (1% diluted) H$_2$ 200 | 1,000 | 30 | 350 |
| i-Type layer: | | | |
| SiH$_4$ 200 GeH$_4$ 50 H$_2$ 100 | 250 | 7 | 350 |
| p-Type layer: | | | |
| SiH$_4$ 10 BF$_3$/H$_2$ 50 (1% diluted) H$_2$ 250 | 1,000 | 30 | 350 |
| n-Type layer: | | | |
| SiH$_4$ 20 PH$_3$/H$_2$ 100 (1% diluted) H$_2$ 200 | 1,000 | 30 | 300 |
| i-Type layer: | | | |
| SiH$_4$ 200 H$_2$ 100 | 250 | 6 | 300 |
| p-Type layer: | | | |
| SiH$_4$ 10 BF$_3$/H$_2$ 50 (1% diluted) H$_2$ 250 | 1,000 | 30 | 300 |

TABLE 4

| Device No. | Uniformity of characteristics | Defect density |
|---|---|---|
| Ex. 2 | 1.10 | 1.45 |
| Comp. 2 | 1.00 | 1.00 |

TABLE 5

Layer-forming conditions:

| Layers<br>Gases used; flow rate (sccm) | Microwave power (W) | Pressure (mTorr) | Substrate temp. (° C.) |
|---|---|---|---|
| n-Type layer: | | | |
| $SiH_4$ 20<br>$PH_3/H_2$ 100 (1% diluted)<br>$H_2$ 200 | 1,000 | 30 | 350 |
| i-Type layer: | | | |
| $SiH_4$ 200<br>$GeH_4$ 50<br>$H_2$ 100 | 200 | 7 | 350 |
| p-Type layer: | | | |
| $SiH_4$ 10<br>$BF_3/H_2$ 50 (1% diluted)<br>$H_2$ 250 | 1,000 | 30 | 350 |
| n-Type layer: | | | |
| $SiH_4$ 20<br>$PH_3/H_2$ 100 (1% diluted)<br>$H_2$ 200 | 1,000 | 30 | 300 |
| i-Type layer: | | | |
| $SiH_4$ 200<br>$H_2$ 100 | 250 | 6 | 300 |
| p-Type layer: | | | |
| $SiH_4$ 10<br>$BF_3/H_2$ 50 (1% diluted)<br>$H_2$ 250 | 1,000 | 30 | 300 |
| n-Type layer: | | | |
| $SiH_4$ 20<br>$PH_3/H_2$ 100 (1% diluted)<br>$H_2$ 200 | 1,000 | 30 | 250 |
| i-Type layer: | | | |
| $SiH_4$ 200<br>$H_2$ 100 | 200 | 5 | 250 |
| p-Type layer: | | | |
| $SiH_4$ 10<br>$BF_3/H_2$ 50 (1% diluted)<br>$H_2$ 250 | 1,000 | 30 | 250 |

TABLE 6

| Device No. | Uniformity of characteristics | Defect density |
|---|---|---|
| Ex. 3 | 1.12 | 1.44 |
| Comp. 3 | 1.00 | 1.00 |

TABLE 7

Substrate:
SUS430BA; width: 360 mm; thickness: 0.13 mm
Reflecting layer:
Silver (Ag), 100 nm thin film
Reflection enhancing layer:
Zinc oxide (ZnO), 1 µm thin film
Gate gas:
$H_2$ from each gate, 700 sccm Layer-forming conditions:

| Layers<br>Gases used; flow rate (sccm) | Microwave power (W) | Pressure (mTorr) | Substrate temp. (° C.) |
|---|---|---|---|
| n-Type layer: | | | |
| $SiH_4$ 40<br>$PH_3/H_2$ 200 (1% diluted)<br>$H_2$ 400 | 800/800 | 40 | 350 |
| i-Type layer: | | | |
| $SiH_4$ 400<br>$H_2$ 200 | 500/500 | 5 | 350 |
| p-Type layer: | | | |
| $SiH_4$ 20<br>$BF_3/H_2$ 100 (1% diluted)<br>$H_2$ 500 | 800/800 | 40 | 350 |

Transparent electrode: ITO($In_2O_3$ + $SnO_2$), 70 nm thin film
Collector electrode: aluminum (Al), 2 µm thin film

TABLE 8

| Device No. | Uniformity of characteristics | Defect density |
|---|---|---|
| Ex. 4 | 1.13 | 1.25 |
| Comp. 4 | 1.00 | 1.00 |

TABLE 9

Substrate:
SUS430BA; width: 120 mm; thickness: 0.13 mm
Reflecting layer:
Silver (Ag), 100 nm thin film
Reflection enhancing layer:
Zinc oxide (ZnO), 1 µm thin film
Gate gas:
$H_2$ from each gate, 700 sccm Layer-forming conditions:

| Layers | Gases used; flow rate (sccm) | Microwave power (W) | Pressure (mTorr) | Substrate temp. (° C.) |
|---|---|---|---|---|
| n-Type layer: | | | | |
| $SiH_4$ | 20 | | | |
| $PH_3/H_2$ (1% diluted) | 100 | 1,000 | 30 | 300 |
| $H_2$ | 200 | | | |
| i-Type layer: | | | | |
| $SiH_4$ | 200 | | | |
| $H_2$ | 100 | 300 | 6 | 300 |
| p-Type layer: | | | | |
| $SiH_4$ | 10 | | | |
| $BF_3/H_2$ (1% diluted) | 50 | 1,000 | 30 | 300 |

TABLE 9-continued

Substrate:
SUS430BA; width: 120 mm; thickness: 0.13 mm
Reflecting layer:
Silver (Ag), 100 nm thin film
Reflection enhancing layer:
Zinc oxide (ZnO), 1 μm thin film
Gate gas:
$H_2$ from each gate, 700 sccm Layer-forming conditions:

| Layers | Gases used; flow rate (sccm) | Microwave power (W) | Pressure (mTorr) | Substrate temp. (° C.) |
|---|---|---|---|---|
| $H_2$ | 250 | | | |

Transparent electrode: ITO ($In_2O_3$ + $SnO_2$), 70 nm thin film
Collector electrode: aluminum (Al), 2 μm thin film

TABLE 10

| Device No. | Uniformity of characteristics | Defect density |
|---|---|---|
| Ex. 5 | 1.15 | 1.35 |
| Comp. 5 | 1.00 | 1.00 |

TABLE 11

Layer-forming conditions:

| Layers | Gases used; flow rate (sccm) | Microwave power (W) | Pressure (mTorr) | Substrate temp. (° C.) |
|---|---|---|---|---|
| n-Type layer: | | | | |
| $SiH_4$ | 20 | | | |
| $PH_3/H_2$ (1% diluted) | 100 | 1,000 | 30 | 350 |
| $H_2$ | 200 | | | |
| i-Type layer: | | | | |
| $SiH_4$ | 200 | | | |
| $GeH_4$ | 50 | 250 | 7 | 350 |
| $H_2$ | 100 | | | |
| p-Type layer: | | | | |
| $SiH_4$ | 10 | | | |
| $BF_3/H_2$ (1% diluted) | 50 | 1,000 | 30 | 350 |
| $H_2$ | 250 | | | |
| n-Type layer: | | | | |
| $SiH_4$ | 20 | | | |
| $PH_3/H_2$ (1% diluted) | 100 | 1,000 | 30 | 300 |
| $H_2$ | 200 | | | |
| i-Type layer: | | | | |
| $SiH_4$ | 200 | | | |
| $H_2$ | 100 | 250 | 6 | 300 |
| p-Type layer: | | | | |
| $SiH_4$ | 10 | | | |
| $BF_3/H_2$ (1% diluted) | 50 | 1,000 | 30 | 300 |
| $H_2$ | 250 | | | |

TABLE 12

| Device No. | Uniformity of characteristics | Defect density |
|---|---|---|
| Ex. 6 | 1.18 | 1.41 |
| Comp. 6 | 1.00 | 1.00 |

TABLE 13

Layer-forming conditions:

| Layers | Gases used; flow rate (sccm) | Microwave power (W) | Pressure (mTorr) | Substrate temp. (° C.) |
|---|---|---|---|---|
| n-Type layer: | | | | |
| $SiH_4$ | 20 | | | |
| $PH_3/H_2$ (1% diluted) | 100 | 1,000 | 30 | 350 |
| $H_2$ | 200 | | | |
| i-Type layer: | | | | |
| $SiH_4$ | 200 | | | |
| $GeH_4$ | 50 | 200 | 7 | 350 |
| $H_2$ | 100 | | | |
| p-Type layer: | | | | |
| $SiH_4$ | 10 | | | |
| $BF_3/H_2$ (1% diluted) | 50 | 1,000 | 30 | 350 |
| $H_2$ | 250 | | | |
| n-Type layer: | | | | |
| $SiH_4$ | 20 | | | |
| $PH_3/H_2$ (1% diluted) | 100 | 1,000 | 30 | 300 |
| $H_2$ | 200 | | | |
| i-Type layer: | | | | |
| $SiH_4$ | 200 | | | |
| $H_2$ | 100 | 250 | 6 | 300 |
| p-Type layer: | | | | |
| $SiH_4$ | 10 | | | |
| $BF_3/H_2$ (1% diluted) | 50 | 1,000 | 30 | 300 |
| $H_2$ | 250 | | | |
| n-Type layer: | | | | |
| $SiH_4$ | 20 | | | |
| $PH_3/H_2$ (1% diluted) | 100 | 1,000 | 30 | 250 |
| $H_2$ | 200 | | | |
| i-Type layer: | | | | |
| $SiH_4$ | 200 | | | |
| $H_2$ | 100 | 200 | 5 | 250 |
| p-Type layer: | | | | |
| $SiH_4$ | 10 | | | |
| $BF_3/H_2$ (1% diluted) | 50 | 1,000 | 30 | 250 |
| $H_2$ | 250 | | | |

TABLE 14

| Device No. | Uniformity of characteristics | Defect density |
|---|---|---|
| Ex. 7 | 1.15 | 1.40 |
| Comp. 7 | 1.00 | 1.00 |

TABLE 15

Substrate:
SUS430BA; width: 360 mm; thickness: 0.13 mm
Reflecting layer:
Silver (Ag), 100 nm thin film
Reflection enhancing layer:
Zinc oxide (ZnO), 1 μm thin film
Gate gas:
$H_2$ from each gate, 700 sccm Layer-forming conditions:

| Layers | Gases used; flow rate (sccm) | Microwave power (W) | Pressure (mTorr) | Substrate temp. (° C.) |
|---|---|---|---|---|
| n-Type layer: | | | | |
| $SiH_4$ | 40 | | | |
| $PH_3/H_2$ | 200 | 800/800 | 40 | 350 |
| (1% diluted) | | | | |
| $H_2$ | 400 | | | |
| i-Type layer: | | | | |
| $SiH_4$ | 400 | | | |
| $H_2$ | 200 | 500/500 | 5 | 350 |
| p-Type layer: | | | | |
| $SiH_4$ | 20 | | | |
| $BF_3/H_2$ | 100 | 800/800 | 40 | 350 |
| (1% diluted) | | | | |
| $H_2$ | 500 | | | |

Transparent electrode: ITO ($In_2O_3$ + $SnO_2$), 70 nm thin film
Collector electrode: aluminum (Al), 2 μm thin film

TABLE 16

| Device No. | Uniformity of characteristics | Defect density |
|---|---|---|
| Ex. 8 | 1.11 | 1.22 |
| Comp. 8 | 1.00 | 1.00 |

What is claimed is:

1. A deposited-film-forming apparatus comprising a plurality of vacuum chambers connected to one another, a member transportable through said plurality of vacuum chambers and capable of receiving desired treatments therein, and a mechanism for relaxing stress generated in a direction of movement of said member in said vacuum chambers by expansion and contraction thereof due to heat, wherein said mechanism for relaxing stress is a sliding mechanism for allowing said vacuum chambers to slide over a surface, provided between said vacuum chambers and said surface atop a stand for supporting said vacuum chambers.

2. The deposited-film-forming apparatus according to claim 1, wherein said sliding mechanism comprises a warped member attached to each leg of said vacuum chambers in contact with said surface.

3. The deposited-film-forming apparatus according to claim 1, wherein said sliding mechanism comprises a spherical member attached to each leg of said vacuum chambers in contact with said surface.

4. The deposited-film-forming apparatus according to claim 1, wherein said sliding mechanism comprises a wheel-like member attached to each leg of said vacuum chambers in contact with said surface.

5. The deposited-film-forming apparatus according to claim 1, wherein said sliding mechanism is constituted so as to limit a shift thereof in a direction right-angled to the transport direction of the belt-like member which passes through said vacuum chambers.

6. The deposited-film-forming apparatus according to claim 1, wherein a lubricant is provided between said sliding mechanism and said surface of said stand.

7. The deposited-film-forming apparatus according to claim 1, wherein at least a part of said vacuum chambers is fixed to said stand.

8. The deposited-film-forming apparatus according to claim 1, wherein said vacuum chambers each has means for forming a deposited film by chemical vapor deposition, sputtering or vacuum deposition.

9. The deposited-film-forming apparatus according to claim 8, wherein a belt-like member passes through said vacuum chambers each having said means for forming a deposited film by chemical vapor deposition, the belt-like member has a cylindrical bending portion, and plasma is generated at said cylindrical bending portion.

10. The deposited-film-forming apparatus according to claim 1, further comprising gas gates provided between said vacuum chambers.

* * * * *

UNITED STATES PATENT AND TRADEMARK OFFICE
CERTIFICATE OF CORRECTION

PATENT NO. : 6,153,013
DATED : November 28, 2000
INVENTOR(S) : Akira Sakai, et al.

It is certified that error appears in the above-identified patent and that said Letters Patent is hereby corrected as shown below:

TITLE PAGE,
Item [56] References Cited, under FOREIGN PATENT DOCUMENTS "6-1288074 12/1986 Japan" should be deleted; and
Under OTHER PUBLICATIONS
"Henkel, et al, J. Vac. Sci. Technol. A 12(5), Sep. 1/Oct. 1994." should be deleted.

Column 1,
Line 47, close up right margin; and
Line 48, close up left margin.

Column 8,
Line 67, "Sets" should read -- sets --.

Column 9:
Line 9, "photovoltaic:" should read -- photovoltaic --.

Column 10,
Line 13, "is;" should read -- is --.

Column 20,
Line 21, "as;" should read -- as --.

Column 21,
Line 14, "was;" should read -- was --.

UNITED STATES PATENT AND TRADEMARK OFFICE
CERTIFICATE OF CORRECTION

PATENT NO. : 6,153,013
DATED : November 28, 2000
INVENTOR(S) : Akira Sakai, et al.

It is certified that error appears in the above-identified patent and that said Letters Patent is hereby corrected as shown below:

Signed and Sealed this

Thirteenth Day of November, 2001

Attest:

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO. : 6,153,013
DATED : November 28, 2000
INVENTOR(S) : Akira Sakai, et al.

Page 1 of 1

It is certified that error appears in the above-identified patent and that said Letters Patent is hereby corrected as shown below:

<u>TITLE PAGE,</u>
Item [56] References Cited, under FOREIGN PATENT DOCUMENTS "6-1288074 12/1986 Japan" should be deleted; and
Under OTHER PUBLICATIONS
"Henkel, et al, J. Vac. Sci. Technol. A 12(5), Sep. 1/Oct. 1994." should be deleted.

<u>Column 1,</u>
Line 47, close up right margin; and
Line 48, close up left margin.

<u>Column 8,</u>
Line 67, "Sets" should read -- sets --.

<u>Column 9:</u>
Line 9, "photovoltaic:" should read -- photovoltaic --.

<u>Column 10,</u>
Line 13, "is;" should read -- is --.

<u>Column 20,</u>
Line 21, "as;" should read -- as --.

<u>Column 21,</u>
Line 14, "was;" should read -- was --.

Signed and Sealed this

Twenty-seventh Day of November, 2001

*Attest:*

*Attesting Officer*

NICHOLAS P. GODICI
*Acting Director of the United States Patent and Trademark Office*